(12) United States Patent
Kang et al.

(10) Patent No.: US 12,532,453 B2
(45) Date of Patent: Jan. 20, 2026

(54) SEMICONDUCTOR DEVICE INCLUDING A THREE-DIMENSIONAL MEMORY CELL AND METHOD FOR FABRICATING THE SAME

(71) Applicant: SK hynix Inc., Gyeonggi-do (KR)

(72) Inventors: Myoung Jin Kang, Gyeonggi-do (KR); Seung Hwan Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 527 days.

(21) Appl. No.: 17/957,208

(22) Filed: Sep. 30, 2022

(65) Prior Publication Data
US 2023/0284434 A1 Sep. 7, 2023

(30) Foreign Application Priority Data
Mar. 4, 2022 (KR) .................. 10-2022-0028022

(51) Int. Cl.
*H10B 12/00* (2023.01)
*H10B 51/20* (2023.01)
*H10B 51/30* (2023.01)
*H10B 53/20* (2023.01)
*H10B 53/30* (2023.01)
*H10D 30/67* (2025.01)

(52) U.S. Cl.
CPC .............. *H10B 12/30* (2023.02); *H10B 12/50* (2023.02); *H10B 51/20* (2023.02); *H10B 51/30* (2023.02); *H10B 53/20* (2023.02); *H10B 53/30* (2023.02); *H10D 30/6735* (2025.01); *H10D 30/6736* (2025.01)

(58) Field of Classification Search
CPC ........ H10B 12/30; H10B 12/50; H10B 51/20; H10B 51/30; H10B 51/40; H10B 53/20; H10B 53/30; H10B 53/40; H10D 30/6735; H10D 30/6736
See application file for complete search history.

(56) References Cited

U.S. PATENT DOCUMENTS

| | | | |
|---|---|---|---|
| 10,607,995 B2 * | 3/2020 | Roberts | H10B 12/05 |
| 2018/0108664 A1 * | 4/2018 | Lee | H10D 30/6892 |
| 2019/0115362 A1 * | 4/2019 | Choi | H10B 43/27 |
| 2022/0375958 A1 * | 11/2022 | Shimabukuro | H10B 43/10 |
| 2023/0253043 A1 * | 8/2023 | Clampitt | H10B 43/27 257/314 |

FOREIGN PATENT DOCUMENTS

| | | | | |
|---|---|---|---|---|
| CN | 201910564592 A | * | 10/2019 | ............. H10B 43/30 |
| KR | 10-2018-0126210 A | | 11/2018 | |
| KR | 10-2021-0062083 A | | 5/2021 | |
| KR | 10-2021-0075689 A | | 6/2021 | |
| KR | 10-2021-0086726 A | | 7/2021 | |
| KR | 20220167989 A | * | 12/2022 | ............. H10B 43/30 |

OTHER PUBLICATIONS

Office Action for Korean Patent Application No. 10-2022-0028022 issued by the Korean Patent Office on Aug. 26, 2025.

* cited by examiner

*Primary Examiner* — Matthew E Warren
(74) *Attorney, Agent, or Firm* — IP & T GROUP LLP

(57) ABSTRACT

A semiconductor device includes: a word line stack disposed over a lower structure and including a plurality of word lines stacked in a direction vertical to a surface of the lower structure; and pillar-shaped slits penetrating edge parts of the word lines and including an etch stopper.

17 Claims, 18 Drawing Sheets

SEMICONDUCTOR DEVICE INCLUDING A THREE-DIMENSIONAL MEMORY CELL AND METHOD FOR FABRICATING THE SAME

CROSS-REFERENCE TO RELATED APPLICATIONS

The present application claims priority to Korean Patent Application No. 10-2022-0028022, filed on Mar. 4, 2022, which is incorporated herein by reference in its entirety.

BACKGROUND

1. Field

The present invention relates to a semiconductor device, and more particularly, to a semiconductor device including a three-dimensional memory cell and a method for fabricating the same.

2. Description of the Related Art

In order to increase the net die of a memory device, the size of a memory cell has reduced. As the size of the memory cell is miniaturized, it is necessary to reduce the parasitic capacitance (Cb) and increase the capacitance. However, it is difficult to increase the net die yield due to the structural limitation of the memory cell.

Recently, three-dimensional semiconductor devices including three-dimensionally arranged memory cells have been considered as a way to address this difficulty.

SUMMARY

Embodiments of the present invention provide a semiconductor device including highly integrated memory cells and a method of fabricating the same.

According to one embodiment of the present invention, a semiconductor device comprises: a word line stack disposed over a lower structure and including a plurality of word lines stacked in a direction vertical to a surface of the lower structure; and pillar-shaped slits penetrating edge parts of the word lines and including an etch stopper.

According to another embodiment of the present invention, a semiconductor device comprises: a word line stack disposed over a lower structure and including a word line stack including a plurality of word lines stacked in a vertical direction to a surface of the lower structure; pillar-shaped slits supporting edge parts of each of the word lines and including a first etch stopper; a linear slit supporting the word line stack and including a second etch stopper; a plurality of active layers disposed between the word line and horizontally spaced apart from each other in an extending direction of the word line; a bit line commonly connected to first ends of the active layers and extending in a vertical direction to a surface of the lower structure; and capacitors respectively connected to second ends of the active layers and stacked in a vertical direction to a surface of the lower structure.

According to still another embodiment of the present invention, a method of fabricating a semiconductor device comprises: forming a stack body including a plurality of sacrificial layers and a plurality of semiconductor layers which are stacked in a direction vertical to a surface of a lower structure over the lower structure; forming a step-shaped contact portion by etching a portion of the stack body; forming a plurality of slits including an etch stopper and penetrating through the step-shaped contact portion; replacing the sacrificial layers of the step-shaped contact portion with insulating sacrificial layers to form a step-shaped contact portion stack; replacing the insulating sacrificial layers of the step-shaped contact portion with word lines; removing the semiconductor layers to form pad level recesses on the step-shaped contact portion stack; and forming word line pads filling the pad level recesses, wherein the etch stopper of the slits directly contacts the word line pads, includes a carbon-based material and SiCO, the slits further includes a liner over the etch stopper and a gap-fill material over the liner, the gap-fill material includes an embedded airgap, the liner includes silicon nitride, the gap-fill material silicon oxide, the slits include pillar-shaped slits and linear slits, and the pillar-shaped slits and the linear slits each include the etch stopper.

According to still another embodiment of the present invention, a semiconductor device comprises: a plurality of word line stacks disposed over a substrate, each of the stacks including a plurality of word lines stacked in a vertical direction to a surface of the substrate and including a plurality of vertically disposed word line pads; a plurality of active layers horizontally spaced apart from each other above the substrate; a bit line commonly connected to first ends of the active layers and extending in a vertical direction above the substrate; data storage elements stacked above the substrate and respectively connected to second ends of the active layers; and slits at least partially filled with materials a) contacted to respective edge parts of each of the word line stacks and b) including an etch stopper formed along a vertical wall of each slit, wherein the respective edge parts of each of the word line stacks are horizontally offset from each other while being disposed at different vertical positions above the substrate.

The present technology replaces active layers between double word lines with word line pads to form thick word line pads, so that word line resistance can be improved.

The present technology may improve reliability by preventing bridging and/or electrical shorting between word line pads by an etch stopper.

DETAILED DESCRIPTION

Figure 1:
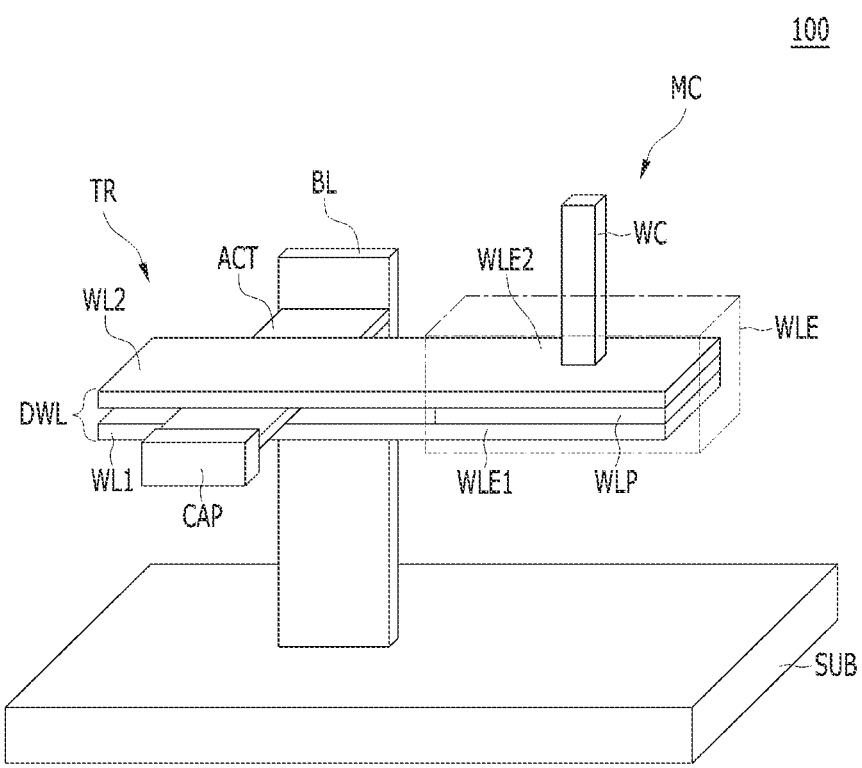
FIG. 1 is a schematic perspective view of a semiconductor device according to embodiments of the present invention.
Figure 1:
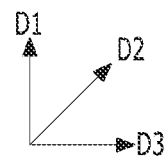

Various embodiments described herein will be described with reference to cross-sectional views, plan views and block diagrams, which are ideal schematic views of the present invention. Therefore, the structures of the drawings may be modified due to fabricating technology and/or tolerances. Accordingly, various embodiments of the present invention are not limited to the specific structures shown in the drawings, but include any changes in the structures that may be produced according to the fabricating process. Therefore, any regions and shapes of regions illustrated in the drawings have schematic views, illustrate specific examples of structures of regions of the various elements, and do not limit the scope of the invention.

In embodiments to be described later, memory cells are vertically stacked to increase memory cell density and reduce parasitic capacitance.

Figure 2:
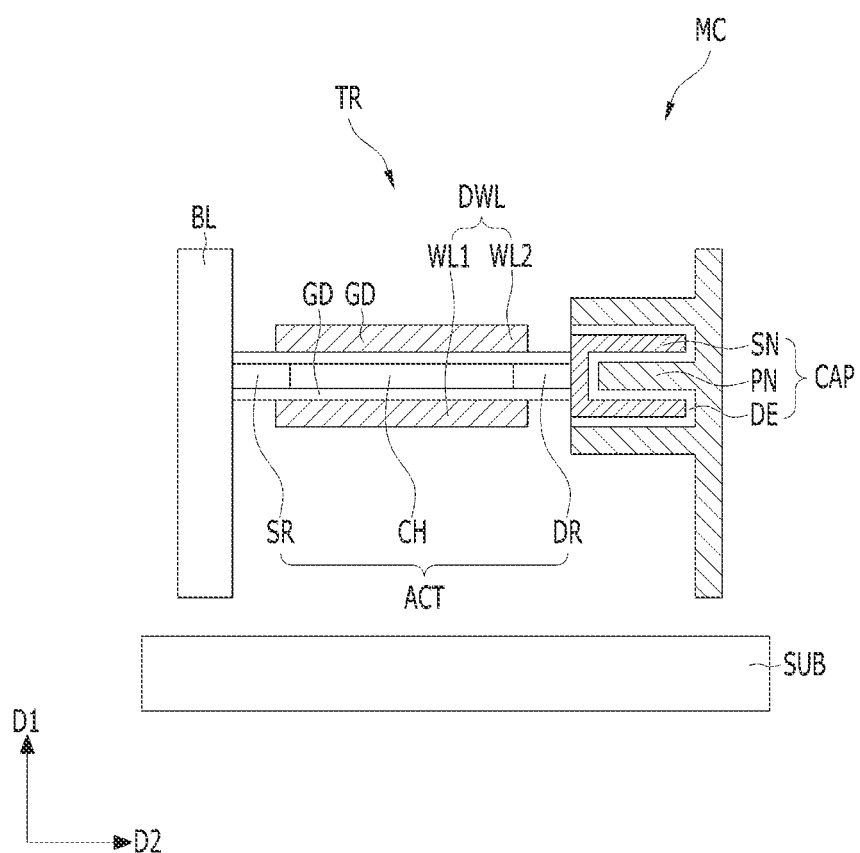
FIG. 2 is a schematic cross-sectional view of the memory cell of FIG. 1.

FIG. 1 is a schematic perspective view of a semiconductor device according to embodiments of the present invention. FIG. 2 is a schematic cross-sectional view of the memory cell of FIG. 1.

Referring to FIGS. 1 and 2, a semiconductor device 100 according to embodiments may include a lower structure SUB and a memory cell MC. The memory cell MC may be disposed at a higher level than the lower structure SUB. The memory cell MC may include a bit line BL, a transistor TR, and a data storage element CAP (detailed below).

The transistor TR may include an active layer ACT and a word line DWL. The word line DWL may include a double word line. For example, the double word line of the word line DWL may include a first word line WL1 and a second word line WL2, and the first and second word lines WL1 and WL2 may face each other with the active layer ACT interposed therebetween.

The data storage element CAP may be memory elements capable of storing data. The data storage element CAP may include a capacitor, a magnetic tunnel junction, or a phase change material. In this embodiment, the data storage element CAP may be a capacitor. Hereinafter, the data storage element CAP will be abbreviated as a capacitor CAP.

The capacitor CAP (as shown in FIG. 2) may include a first electrode SN, a dielectric layer DE, and a second electrode PN.

The bit line BL may be a vertical conductive line oriented vertically along the first direction D1, and the word line DWL may be a horizontal conductive line oriented horizontally along the third direction D3. It may be a horizontal conductive line. The active layer ACT may be a horizontal conductive layer oriented horizontally in the second direction D2.

The bit line BL may extend in a first direction D1 perpendicular to the surface of the lower structure SUB. The active layer ACT may extend in a second direction D2 parallel to the surface of the lower structure SUB. The word line DWL may extend in a third direction D3 parallel to the surface of the lower structure SUB, and the third direction D3 may intersect the first and second directions D1 and D2.

The bit line BL may be vertically oriented along the first direction D1. The bit line BL may be referred to as a vertically oriented bit line or a pillar-shaped bit line. The bit line BL may include a conductive material. The bit line BL may include a silicon-based material, a metal-based material, or a combination thereof. The bit line BL may include silicon, metal, metal nitride, metal silicide, or a combination thereof. The bit line BL may include polysilicon, titanium nitride, tungsten, or a combination thereof. For example, the bit line BL may include polysilicon or titanium nitride (TiN) doped with N-type impurities. The bit line BL may include a TiN/W stack including titanium nitride and tungsten on titanium nitride.

The word line DWL may extend along the third direction D3, and the active layer ACT may extend along the second direction D2. The active layer ACT may be horizontally arranged along the second direction D2 from the bit line BL. The word line DWL may include a pair of word lines, for example, a first word line WL1 and a second word line WL2. The first word line WL1 and the second word line WL2 may face each other along the first direction D1 with the active layer ACT interposed therebetween.

The active layer ACT may be horizontally aligned between the bit line BL and the capacitor CAP. A first side of the active layer ACT may be connected to the bit line BL, and a second side of the active layer ACT may be connected to the capacitor CAP. The active layer ACT may include a semiconductor material or an oxide semiconductor material. For example, the active layer ACT may include silicon, germanium, silicon-germanium, or indium gallium zinc oxide (IGZO). The active layer ACT may include polysilicon or monocrystalline silicon.

The active layer ACT may include the channel CH, the first source/drain region SR between the channel CH and the bit line BL, and the second source/drain region DR between the channel CH and the capacitor CAP. The channel CH may be defined between the first source/drain region SR and the second source/drain region DR. The channel CH and the word line DWL may vertically overlap in the first direction D1.

The first source/drain region SR and the second source/drain region DR may be doped with impurities of the same conductivity type. The first source/drain region SR and the second source/drain region DR may be doped with an N-type impurity or a P-type impurity. The first source/drain region SR and the second source/drain region DR may include at least one impurity selected from Arsenic (As), Phosphorus (P), Boron (B), Indium (In), and a combination thereof. The first source/drain region SR may contact the bit line BL, and the second source/drain region DR may contact the first electrode SN.

The transistor TR in this embodiment is a cell transistor and may have a word line DWL. In the word line DWL, the first word line WL1 and the second word line WL2 may have the same potential. For example, the first word line WL1 and the second word line WL2 may form a pair, and the same word line driving voltage may be applied to the first word line WL1 and the second word line WL2. As described above, the memory cell MC according to one embodiment of the present invention may have a double word line disposed adjacent to the two first and second word lines WL1 and WL2 in one channel CH.

In another embodiment, the first word line WL1 and the second word line WL2 may have different potentials. For example, a word line driving voltage may be applied to the first word line WL1, and a ground voltage may be applied to the second word line WL2. The second word line WL2 may be referred to as a back word line or a shield word line. In another embodiment, a ground voltage may be applied to the first word line WL1, and a word line driving voltage may be applied to the second word line WL2.

In another embodiment, the word line DWL may have a single word line structure, that is, the word line DWL may include only the first word line WL1 or only the second word line WL2.

In another embodiment, the word line DWL may have a gate all around structure. The gate all around structure may extend along the third direction D3 while surrounding the active layer ACT.

The active layer ACT may have a thickness smaller than that of the first and second word lines WL1 and WL2. In other words, a vertical thickness of the active layer ACT in the first direction D1 may be thinner than a vertical thickness of each of the first and second word lines WL1 and WL2 in the first direction D1. As such, the thin active layer ACT may be referred to as a thin-body active layer. The thin active layer ACT may include the thin-body channel CH, and the thin-body channel CH may have a thickness of 10 nm or less. In another embodiment, the channel CH may have the same vertical thickness as the first and second word lines WL1 and WL2.

An upper surface and a lower surface of the active layer ACT may have a flat surface. That is, an upper surface and a lower surface of the active layer ACT may be parallel to each other in the second direction D2.

A gate insulating layers GD may be formed between the first word line WL1 and the active layer ACT and between the second word line WL2 and the active layer ACT. The gate insulating layers GD may be formed of silicon oxide, silicon nitride, metal oxide, metal oxynitride, metal silicate, a high-k material, a ferroelectric material, and an antiferroelectric material or a combination thereof. The gate insulating layers GD may include $SiO_2$, $Si_3N_4$, $HfO_2$, $Al_2O_3$, $ZrO_2$, AlON, HfON, HfSiO, HfSiON, or HfZrO.

Each of the first and second word lines WL1 and WL2 may include a metal, a metal mixture, a metal alloy, or a semiconductor material. Each of the first and second word lines WL1 and WL2 may include titanium nitride, tungsten, polysilicon, or a combination thereof. For example, each of the first and second word lines WL1 and WL2 may include a TiN/W stack in which titanium nitride and tungsten are sequentially stacked. Each of the first and second word lines WL1 and WL2 may include an N-type work function material or a P-type work function material. The N-type work function material may have a low work function of 4.5 eV or less, and the P-type work function material may have a high work function of 4.5 eV or more.

The capacitor CAP may be horizontally disposed along the second direction D2 from the transistor TR. The capacitor CAP may include a first electrode SN extending horizontally from the active layer ACT in the second direction D2. The capacitor CAP may further include a dielectric layer DE and a second electrode PN on the first electrode SN. The first electrode SN, the dielectric layer DE, and the second electrode PN may be horizontally arranged in the second direction D2. The first electrode SN may have a horizontally oriented cylinder-shape (as illustrated in FIG. 2). The dielectric layer DE may conformally cover the cylinder inner wall and the cylinder outer wall of the first electrode SN. The second electrode PN may have a shape extending to a cylinder inner wall and a cylinder outer wall of the first electrode SN on the dielectric layer DE.

The first electrode SN may have a three-dimensional structure, and the first electrode SN having the three-dimensional structure may have a horizontal three-dimensional structure oriented along the second direction D2. As an example of the three-dimensional structure, the first electrode SN may have a cylinder shape (as illustrated in FIG. 2). In another embodiment, the first electrode SN may have a pillar shape or a pylinder shape. The pillar shape may refer to a structure in which a pillar shape and a cylinder shape are merged.

The second electrode PN may be disposed on the outer and inner walls of the cylinder of the first electrode SN (as illustrated in FIG. 2).

The first electrode SN and the second electrode PN may include a metal, a noble metal, a metal nitride, a conductive metal oxide, a conductive noble metal oxide, a metal carbide, a metal silicide, or a combination thereof. For example, the first electrode SN and the second electrode PN may be formed of titanium (Ti), titanium nitride (TiN), tantalum (Ta), tantalum nitride (TaN), tungsten (W) or tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), titanium nitride/tungsten (TiN/W) stack, and a tungsten nitride/tungsten (WN/W) stack. The second electrode PN may include a combination of a metal-based material and a silicon-based material. For example, the second electrode PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the inside of the cylinder of the first electrode SN on the titanium nitride, and titanium nitride (TiN) may be a capacitor. It may serve as the second electrode PN of the capacitor CAP, and tungsten nitride may be a low-resistance material.

The dielectric layer DE may be referred to as a capacitor dielectric layer. The dielectric layer DE may include silicon oxide, silicon nitride, a high-k material, or a combination thereof. The high-k material may have a higher dielectric constant than silicon oxide. Silicon oxide ($SiO_2$) may have a dielectric constant of about 3.9, and the dielectric layer DE may include a high-k material having a dielectric constant of 4 or more. The high-k material may have a dielectric constant of about 20 or more. High dielectric constant materials may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). In another embodiment, the dielectric layer DE may be formed of a composite layer including two or more layers of the aforementioned high-k material.

The dielectric layer DE may be formed of zirconium-based oxide. The dielectric layer DE may have a stack structure including at least zirconium oxide ($ZrO_2$). The stack structure including zirconium oxide ($ZrO_2$) may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked on zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide ($ZrO_2$)-based layer. In another embodiment, the dielectric layer DE may be formed of hafnium (Hf)-based oxide. The dielectric layer DE may have a stack structure including at least hafnium oxide ($HfO_2$). The stack structure including hafnium oxide ($HfO_2$) may include an HA ($HfO_2/Al_2O_3$) stack or an HAH ($HfO_2/Al_2O_3/HfO_2$) stack. The HA stack may have a structure in which aluminum oxide ($Al_2O_3$) is stacked on hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide (HfO$_2$)-based layer. In the ZA stack, ZAZ stack, HA stack, and HAH stack, aluminum oxide (Al$_2$O$_3$) may have higher band gap energy (hereinafter abbreviated as bandgap) than zirconium oxide (ZrO$_2$) and hafnium oxide (HfO$_2$). Aluminum oxide (Al$_2$O$_3$) may have a lower dielectric constant than zirconium oxide (ZrO$_2$) and hafnium oxide (HfO$_2$). Accordingly, the dielectric layer DE may include a stack of a high-k material and a high-bandgap material having a bandgap greater than that of the high-k material. The dielectric layer DE may include silicon oxide (SiO$_2$) as a high bandgap material other than aluminum oxide (Al$_2$O$_3$). Since the dielectric layer DE includes a high bandgap material, leakage current may be suppressed. The high-bandgap material may be thinner than the high-k material. In another embodiment, the dielectric layer DE may include a laminated structure in which a high-k material and a high-bandgap material are alternately stacked. For example, ZAZA (ZrO$_2$/Al$_2$O$_3$/ZrO$_2$/Al$_2$O$_3$) stack, ZAZAZ (ZrO$_2$/Al$_2$O$_3$/ZrO$_2$/Al$_2$O$_3$/ZrO$_2$) stack, HAHA (HfO$_2$/Al$_2$O$_3$/HfO$_2$/Al$_2$O$_3$) stack, or HAHAH (HfO$_2$/Al$_2$O$_3$/HfO$_2$/Al$_2$O$_3$/HfO$_2$) stack. In the above laminated structure, aluminum oxide (Al$_2$O$_3$) may be thinner than zirconium oxide (ZrO$_2$) and hafnium oxide (HfO$_2$).

In another embodiment, the dielectric layer DE may include a stack structure, a laminated structure, or a mutual mixed structure including different layers of the following dielectrics stacked together: zirconium oxide, hafnium oxide, and aluminum oxide.

In another embodiment, the dielectric layer DE may include a ferroelectric material or an antiferroelectric material.

In another embodiment, an interface control layer for improving leakage current may be further formed between the first electrode SN and the dielectric layer DE. The interface control layer may include titanium oxide (TiO$_2$), niobium oxide, or niobium nitride. The interface control layer may also be formed between the second electrode PN and the dielectric layer DE.

The capacitor CAP may include a metal-insulator-metal (MIM) capacitor. The first electrode SN and the second electrode PN may include a metal-based material.

The capacitor CAP may be replaced with another data storage material. For example, the data storage material may be a phase change material, a magnetic tunnel junction (MTJ), or a variable resistance material.

Referring back to FIG. 1, the word line DWL may include the word line edge portion WLE, and the contact plug WC may be connected to the word line edge portion WLE. The word line edge portion WLE may refer to end portions of the first and second word lines WL1 and WL2. For example, the word line edge part WLE may include a first word line edge part WLE1 and a second word line edge part WLE2. The word line edge part WLE may further include a word line pad part WLP between the first word line edge part WLE1 and the second word line edge part WLE2. The word line pad part WLP may be horizontally spaced apart from the active layer ACT. The active layer ACT may not be disposed between the first word line edge portion WLE1 and the second word line edge part WLE2. The word line pad part WLP may directly contact the first word line edge part WLE1 and the second word line edge part WLE2. The first word line edge part WLE1, the word line pad part WLP and the second word line edge part WLE2 may be vertically stacked in the first direction D1. Ends of the word line edge part WLE, that is, ends of the first and second word line edge parts WLE1 and WLE2 may have a vertical flat surface or a vertical flat edge. Accordingly, the end of the word line pad part WLP may be self-aligned with the end of the first word line edge part WLE1 and the end of the second word line edge part WLE2.

The first and second word line edge parts WLE1 and WLE2 may be formed of the same material as the first and second word lines WL1 and WL2. Each of the first and second word line edge parts WLE1 and WLE2 may include a metal, a metal mixture, a metal alloy, or a semiconductor material. Each of the first and second word line edge parts WLE1 and WLE2 may include titanium nitride, tungsten, polysilicon, or a combination thereof. For example, each of the first and second word line edge parts WLE1 and WLE2 may include a TiN/W stack in which titanium nitride and tungsten are sequentially stacked.

The word line pad part WLP may be formed of the same material as the first and second word line edge parts WLE1 and WLE2. The word line pad part WLP may include a metal, a metal mixture, a metal alloy, or a semiconductor material. The word line pad part WLP may include titanium nitride, tungsten, polysilicon, or a combination thereof. For example, the word line pad part WLP may include a TiN/W stack in which titanium nitride and tungsten are sequentially stacked. The first word line edge part WLE1 and the second word line edge part WLE2 may be electrically connected to each other by the word line pad part WLP. A stack stacked in the order of the first word line edge part WLE1, the word line pad part WLP and the second word line edge part WLE2 may be a triple-layered TiN/W stack.

The contact plug WC may extend vertically in the first direction D1. The contact plug WC may be directly connected to the second word line edge part WLE2. The contact plug WC may include a metal-based material.

Figure 3:
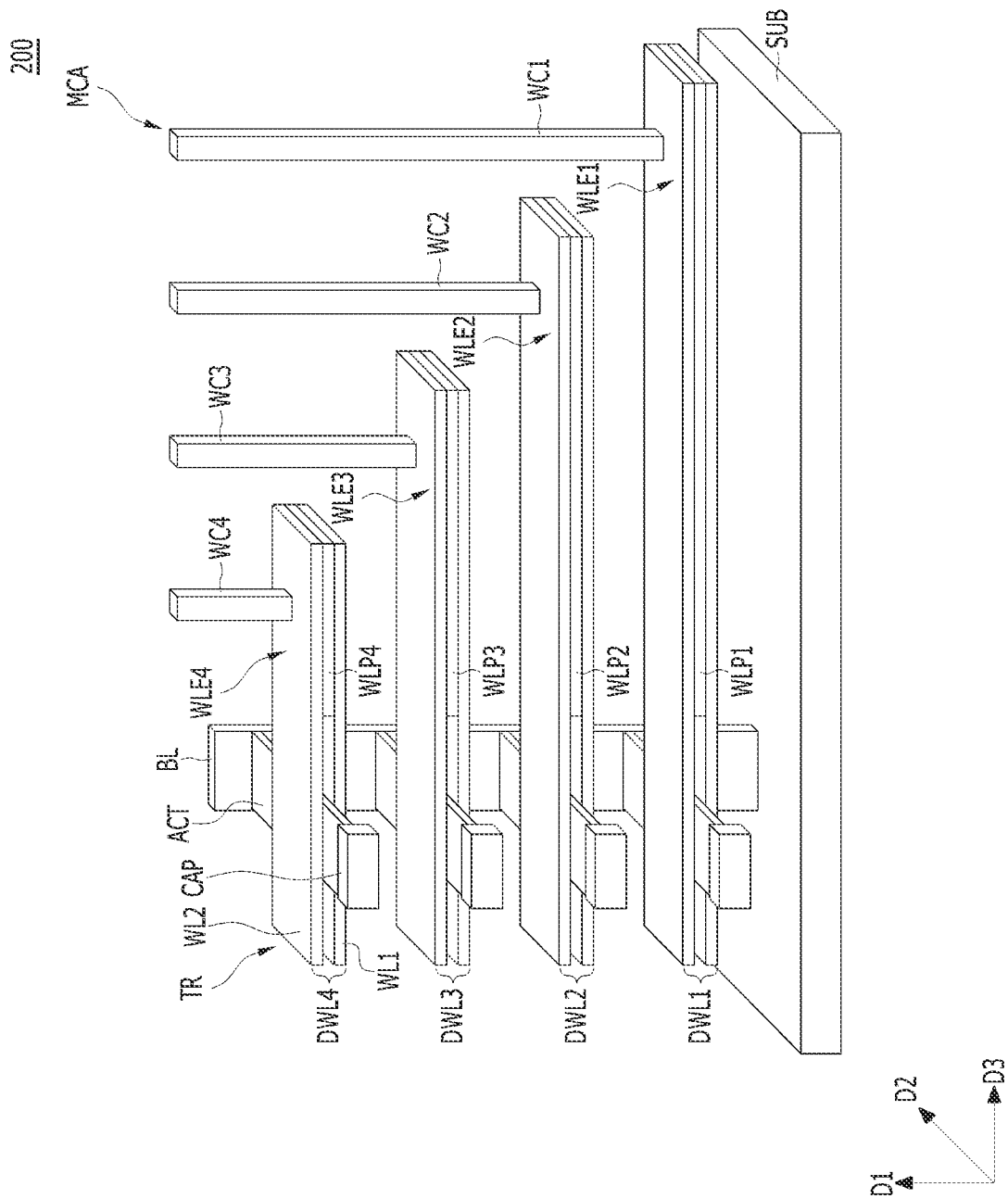
FIG. 3 is a schematic perspective view of a semiconductor device according to embodiments of the present invention.
Figure 4:
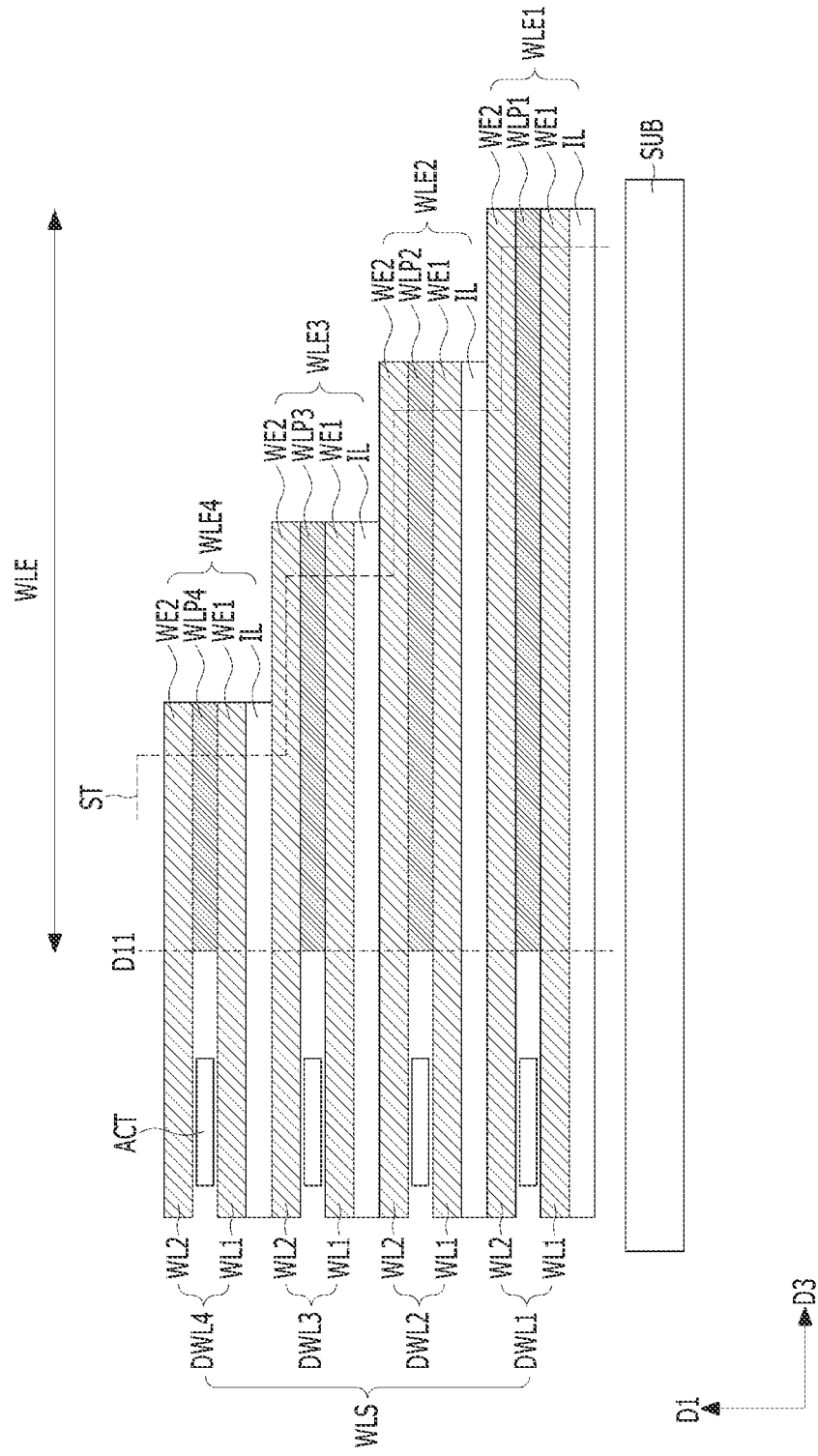
FIG. 4 is a schematic cross-sectional view of the word line stack of FIG. 3.

FIG. 3 is a schematic perspective view of a semiconductor device according to embodiments of the present invention. FIG. 4 is a schematic cross-sectional view of the word line stack WLS of FIG. 3.

Referring to FIGS. 3 and 4, the semiconductor device 200 may include a memory cell array MCA. The memory cell array MCA may include a plurality of memory cells. Here, the memory cells of the memory cell array MCA may include the memory cells MC of FIGS. 1 and 2. The memory cells MC of FIGS. 1 and 2 may be vertically stacked along the first direction D1 as shown in FIG. 3.

The memory cell array MCA may include a plurality of active layers ACT and a plurality of word lines DWL1 to DWL4 vertically stacked on the lower structure SUB. Each of the word lines DWL1 to DWL4 may include first and second word lines WL1 and WL2 facing each other with the active layer ACT interposed therebetween. The word lines DWL1 to DWL4 may be vertically stacked along the first direction D1 from the surface of the lower structure SUB. The stack of the word lines DWL1 to DWL4 may be abbreviated as a 'word line stack WLS'.

The memory cell array MCA may further include a bit line BL, a plurality of transistors TR, and a plurality of capacitors CAP on the lower structure SUB. Each of the transistors TR may include an active layer ACT and word lines DWL1 to DWL4.

The word lines DWL1 to DWL4 may extend horizontally in the third direction D3.

The word line stack WLS may include a word line edge portion WLE. The word line edge portion WLE may refer to end portions of the word lines DWL1 to DWL4. The word line edge part WLE may include word line edge parts WLE1 to WLE4. Contact plugs WC1 to WC4 may be respectively connected to the word line edge parts WLE1 to WLE4. The word line edge portion WLE may refer to end portions of the first and second word lines WL1 and WL2. Each of the word line edge parts WLE1 to WLE4 may include a first edge part WE1 and a second edge part WE2. The word line edge parts WLE1 to WLE4 may further include word line pad parts WLP1 to WLP4, respectively. The word line pad parts WLP1 to WLP4 may be horizontally spaced apart from the active layers ACT. The active layers ACT may not be located in the word line edge part WLE. The word line pad parts WLP1 to WLP4 may be formed between the first edge part WE1 and the second edge part WE2. The word line pad parts WLP1 to WLP4 may directly contact the first and second edge parts WE1 and WE2.

The word line pad parts WLP1 to WLP4 may include first vertical flat surfaces and second vertical flat surfaces. The first vertical flat surfaces of the word line pad parts WLP1 to WLP4 may be aligned with the first vertical level A11. The first vertical flat surfaces of the word line pad parts WLP1 to WLP4 may be spaced apart from the active layers ACT by a first distance, and the second vertical flat surfaces of the word line pad parts WLP1 to WLP4 may be spaced apart from the active layers ACT by a second distance. Here, the second distance may be greater than the first distance. The second vertical flat surfaces of the word line pad parts WLP1 to WLP4 may be horizontally spaced apart from the first vertical flat surfaces. The first vertical flat surfaces of the word line pad parts WLP1 to WLP4 may be aligned with the first vertical level A11. In each of the word line pad parts WLP1 to WLP4, second vertical flat surfaces of the word line pad parts WLP1 to WLP4 may be self-aligned to the ends of the first and second edge parts WLE1 and WLE2 of the word line edge parts WLE1 to WLE4. The second vertical flat surfaces of the word line pad parts WLP1 to WLP4 may be disposed along the second vertical level ST. Here, the second vertical level ST may not refer to a level disposed linearly along the first direction D1. For example, the second vertical level ST may be a vertical level having a stepped profile. Hereinafter, the second vertical level ST is abbreviated as a step shape ST.

The word line edge part WLE of the word line stack WLS may have a step shape ST. For example, ends of the word line edge parts WLE1 to WLE4 may not be aligned with each other. Ends of the word line edge parts WLE1 to WLE4 may not be linearly aligned along the first direction D1, but may be disposed along a step shape ST in the first direction D1. The second vertical flat surfaces of the word line pad parts WLP1 to WLP4 may not be linearly aligned along the first direction D1, but may be disposed along the step shape ST in the first direction D1.

The word line pads WLP1 to WLP4 may extend horizontally in the third direction D3. The word line pads WLP1 to WLP4 may have different horizontal lengths. A horizontal length may gradually decrease from the lowest word line pad WLP1 toward the highest word line pad WLP4.

The word line stack WLS may further include cell isolation layers IL (as illustrated in FIG. 4), and the cell isolation layers IL may be disposed between the vertically disposed word lines DWL1 to DWL4.

As described above, the word line edge part WLE may be a stack structure including the first edge part WE1, the second edge part WE2, and the word line pad parts WLP1 to WLP4 between the first edge part WE1 and the second edge part WE2. Since the word line pad parts WLP1 to WLP4 may be formed between the first edge parts WE1 and the second edge parts WE2, the resistance of the word lines DWL1 to DWL4 may be improved.

Figure 5:
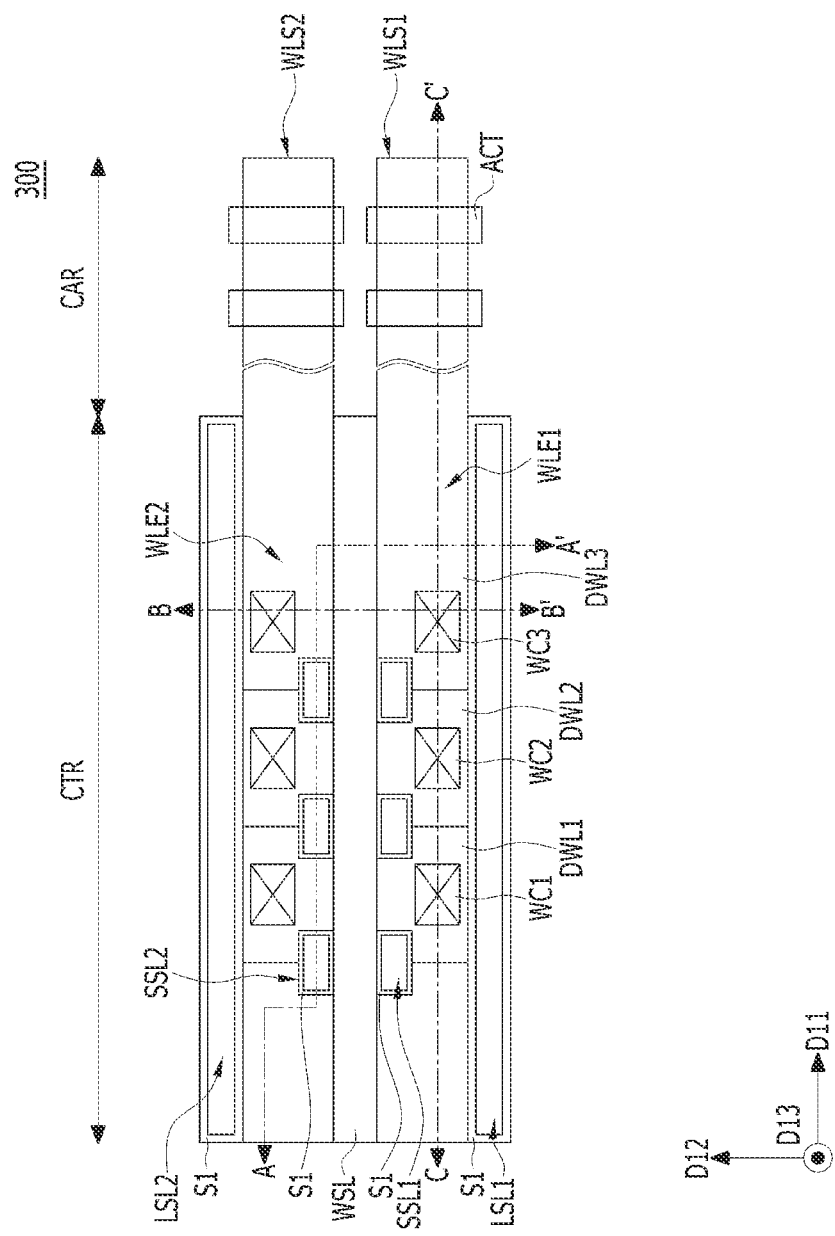
FIG. 5 is a schematic plan view of a semiconductor device according to other embodiments of the present invention.

FIG. 5 is a schematic plan view of a semiconductor device according to other embodiments of the present invention.

Figure 6:
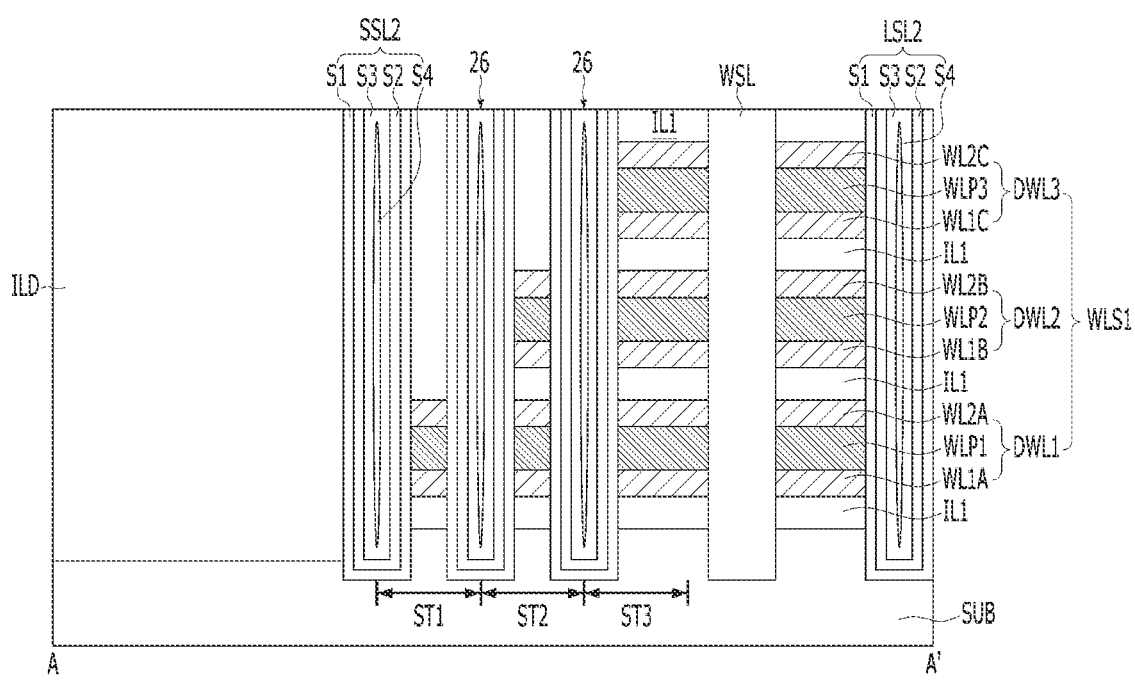
FIG. 6 is a cross-sectional view taken along line A-A' of FIG. 5.
Figure 7:
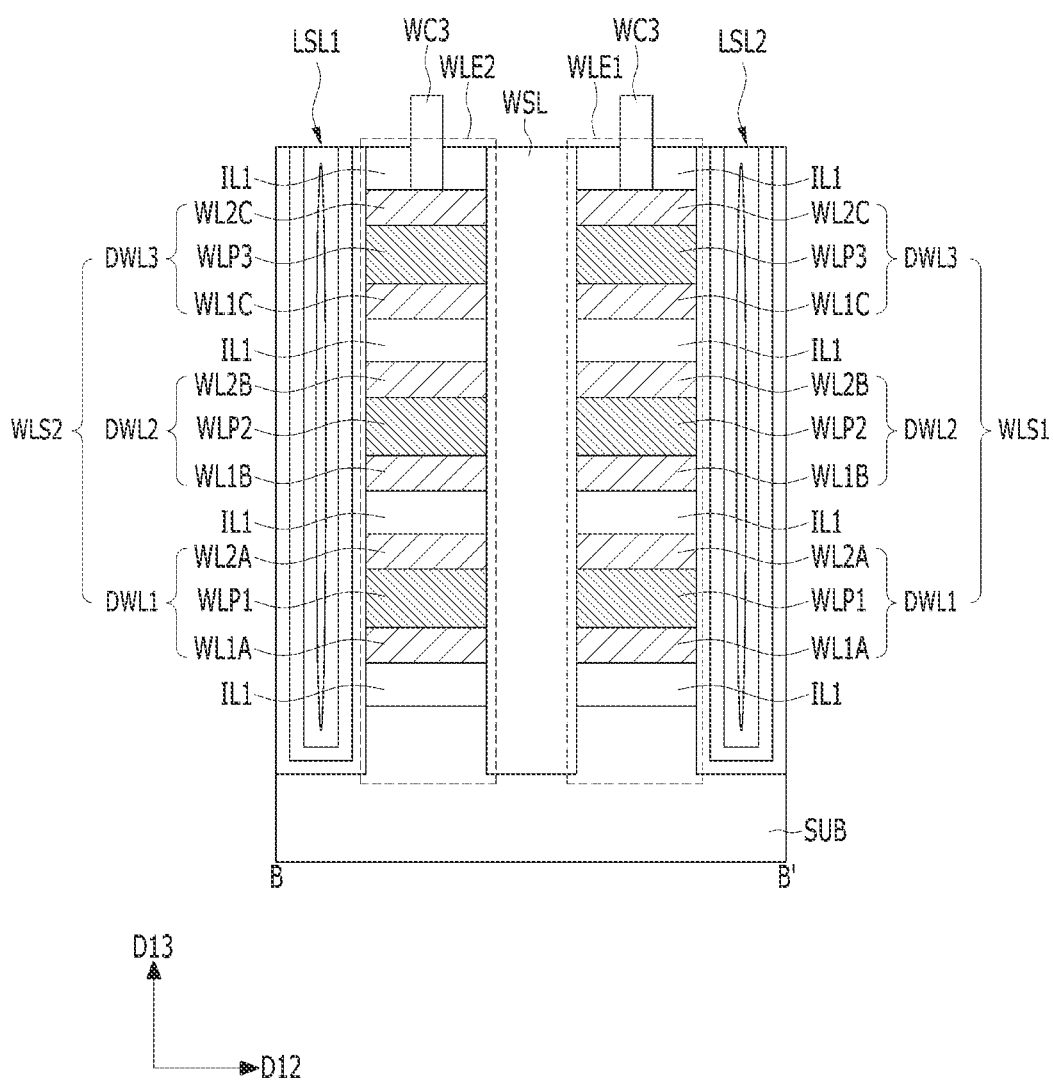
FIG. 7 is a cross-sectional view taken along line B-B' of FIG. 5.
Figure 8:
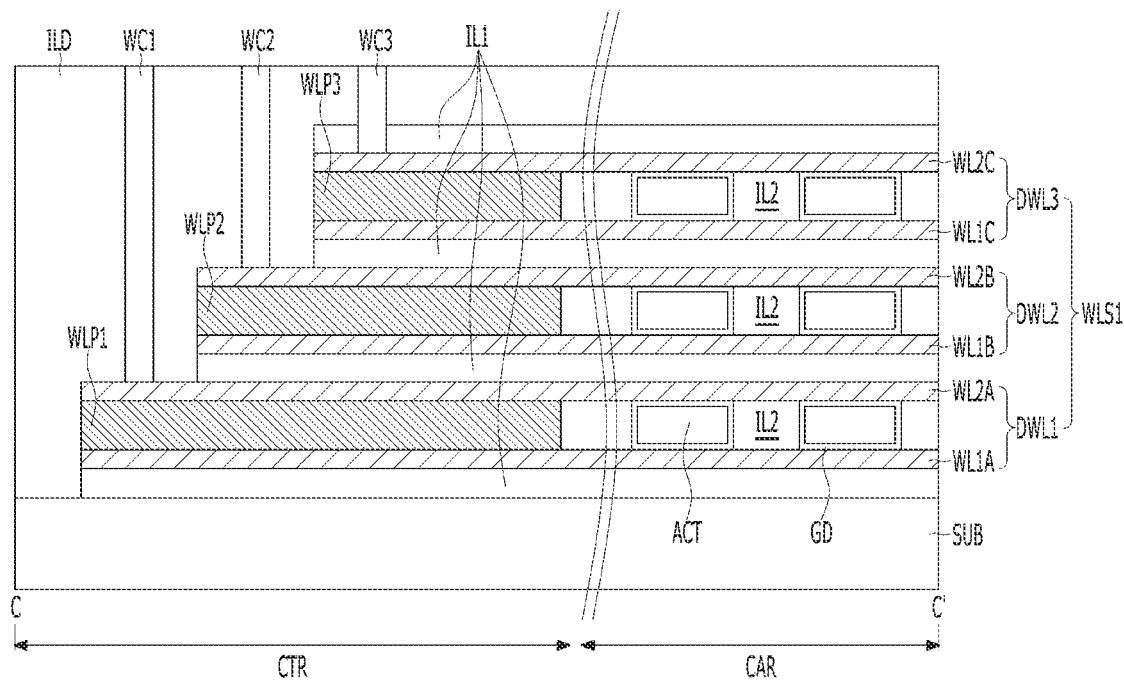
FIG. 8 is a cross-sectional view taken along line C-C' of FIG. 5.

FIG. 6 is a cross-sectional view taken along line A-A' of FIG. 5, FIG. 7 is a cross-sectional view taken along line B-B' of FIG. 5, and FIG. 8 is a cross-sectional view taken along line C-C' of FIG. 5. In FIGS. 5 to 8, detailed descriptions of duplicate components with those of FIGS. 1 to 4 will be omitted.

Referring to FIGS. 5 to 8, the semiconductor device 300 may include a plurality of word line stacks WLS1 and WLS2, and each of the word line stacks WLS1 and WSL2 may include a plurality of word lines DWL1 to DWL3. The word lines DWL1 to DWL3 may extend horizontally in the first direction D11. The word lines DWL1 to DWL3 may be spaced apart from each other in the second direction D12. The word lines DWL1 to DWL3 may be vertically stacked along the third direction D13.

The semiconductor device 300 may include a cell array unit CAR and a contact portion CTR. A plurality of memory cells may be located in the cell array unit CAR, and a plurality of contact plugs WC1 to WC3 may be located in the contact portion CTR. Each of the memory cells may include word line stacks WLS1 and WLS2, active layers ACT, and gate insulating layers GD. For a detailed description of the memory cells, reference will be made to the memory cells of FIGS. 1 to 4.

The word line stacks WLS1 and WLS2 may include word line edge parts WLE1 and WLE2, respectively. Each of the word line edge parts WLE1 and WLE2 may have a step shape, and the step shape of the word line edge parts WLE1 and WLE2 may be defined in the contact portion CTR. The word line edge parts WLE1 and WLE2 may include word line pads WLP1 to WLP3, and a plurality of word line pads WLP1 to WLP3 may be disposed in the contact portion CTR. The word line pads WLP1 to WLP3 may extend horizontally in the first direction D11. A horizontal length may gradually decrease from the lowest word line pad WLP1 toward the highest word line pad WLP3. Contact plugs WC1, WC2, and WC3 may be connected to each of the word line edge parts WLE1 and WLE2. The step shape of the word line edge parts WLE1 and WLE2 may be covered by the interlayer insulating layer ILD (as shown FIGS. 6 and 8). The contact portion CTR may be referred to as a stepped contact portion.

The contact portion CTR may further include a word line separation slit WSL and large slits LSL1 and LSL2 (as shown in FIG. 5). Word line edge parts WLE1 and WLE2 of the word line stacks WLS1 and WLS2 may be disposed between the word line separation slit WSL and the large slits LSL1 and LSL2. For example, the word line separation slit WSL may be disposed between the word line edge part WLE1 of the first word line stack WLS1 and the word line edge part WLE2 of the second word line stack WLS2. The first word line stack WLS1 may be disposed between the word line separation slit WSL and the first large slit LSL1, and the second word line stack WLS2 may be disposed between the word line separation slit WSL and the second large slit LSL2. The word line separation slit WSL and the large slits LSL1 and LSL2 may extend along the first direction D11.

The semiconductor device 300 may further include small slits SSL1 and SSL2. The small slits SSL1 and SSL2 and the large slits LSL1 and LSL2 may serve to support the word line edge parts WLE1 and WLE2 of the word line stacks WLS1 and WLS2. The small slits SSL1 and SSL2 and the large slits LSL1 and LSL2 may serve to support the word line pads WLP1, WLP2 and WLP3 of the word line edge parts WLE1 and WLE2. The small slits SSL1 and SSL2 may extend vertically along the third direction D13 and may have a shape penetrating the word line edge portions WLE1 and WLE2, respectively. The small slits SSL1 and SSL2 may penetrate sidewalls of the word line edge parts WLE1 and WLE2. The first small slits SSL1 may penetrate one sidewall of the first word line edge portion WLE1, and the second small slits SSL2 may penetrate one sidewall of the second word line edge part WLE2. The first and second small slits SSL1 and SSL2 may directly contact the word line separation slit WSL. The small slits SSL1 and SSL2 may be referred to as pillar-shaped slits, and the large slits LSL1 and LSL2 may be referred to as linear slits.

The word line separation slit WSL and the large slits LSL1 and LSL2 may be formed of (that is filled with) different materials. The word line separation slit WSL and the small slits SSL1 and SSL2 may be formed of (that is filled with) different materials. The large slits LSL1 and LSL2 and the small slits SSL1 and SSL2 may be formed of (that is filled with) the same material or different materials. Each of the word line separation slit WSL, the large slits LSL1 and LSL2, and the small slits SSL1 and SSL2 may include a single dielectric material or a multi-layered dielectric material.

Each of the large slits LSL1 and LSL2 and the small slits SSL1 and SSL2 may include an etch stopper S1, a liner S2 and a gap-fill material S3, and the gap-fill material S3 may include an embedded air gap S4 (as illustrated in FIG. 6). For example, each of the large slits LSL1 and LSL2 may include a first edge stopper S1, a first liner S2, and a first gap-fill material S3, and the first gap-fill material S3 may include an embedded air gap S4. Each of the small slits SSL1 and SSL2 may include a first edge stopper S1, a first liner S2, and a first gap-fill material S3, and the first gap-fill material S3 may include an embedded air gap S4 (as illustrated in FIG. 6).

The large slits LSL1 and LSL2 and the small slits SSL1 and SSL2 may directly contact the word line pads WLP1, WLP2 and WLP3. The etch stoppers S1 of the large slits LSL1 and LSL2 and the small slits SSL1 and SSL2 may directly contact the word line pads WLP1, WLP2 and WLP3. The etch stoppers S1 of the small slits SSL1 and SSL2 may directly contact the word line separation slit WSL.

The etch stoppers S1 and the gap-fill materials S3 may include an oxide, and the liners S2 may include a nitride. The etch stoppers S1 may be carbon-containing silicon oxide (SiCO), and the gap-fill materials S3 may be carbon-free silicon oxide. In this embodiment, the etch stoppers S1 may include SiCO, and the gap-fill materials S3 may include $SiO_2$. SiCO may not be removed during the etching of $SiO_2$. That is, SiCO has better resistance to wet etching than $SiO_2$. The liners S2 may include silicon nitride. The liners S2 may serve to prevent the etch stoppers S1 from being oxidized during deposition of the gap-fill materials S3. The embedded air gaps S4 of the gap-fill materials S3 may serve to reduce parasitic capacitance between the adjacent word line stacks WSL1 and WSL2.

Since the large slits LSL1 and LSL2 and the small slits SSL1 and SSL2 include the etch stoppers S1, resistance to wet etching is excellent. Accordingly, it is possible to prevent an etch loss to prevent a bridge or electrical short between the vertically disposed word line pads WLP1 to WLP3.

The first and second word line stacks WLS1 and WLS2 may be disposed on the lower structure SUB.

Each of the first and second word line stacks WLS1 and WLS2 may include a plurality of word lines DWL1 to DWL3. Each of the word lines DWL1 to DWL3 may include a double word line, that is, the first word lines WL1A, WL1B, and WL1C and the second word lines WL2A, WL2B, and WL2C. A first horizontal level insulating layer IL1 may be disposed between the word lines DWL1 to DWL3 vertically adjacent in the third direction D13 (as illustrated in FIG. 7). In the cell array unit CAR, a plurality of active layers ACT may be disposed between the first word lines WL1A to WL1C and the second word lines WL2A to WL2C. A second horizontal level insulating layer IL2 may be disposed between the active layers ACT vertically adjacent in the first direction D11 (as illustrated in FIG. 8). The first and second horizontal level insulating layers IL1 and IL2 may be referred to as cell isolation layers. In the contact portion CTR, word line pad units WLP1 to WLP3 may be disposed between the first word lines WL1A to WL1C and the second word lines WL2A to WL2D. Contact plugs WC1 to WC3 may be connected to each of the second word lines WL2A to WL2C. The contact plugs WC1 to WC3 may pass through the interlayer insulating layer ILD to be connected to each of the second word lines WL2A to WL2C.

FIGS. 9 to 25 are diagrams illustrating a method of fabricating a semiconductor device according to embodiments of the present invention. FIGS. 9 to 25 illustrate a fabrication method taken along line A-A' of FIG. 5.

Figure 9:
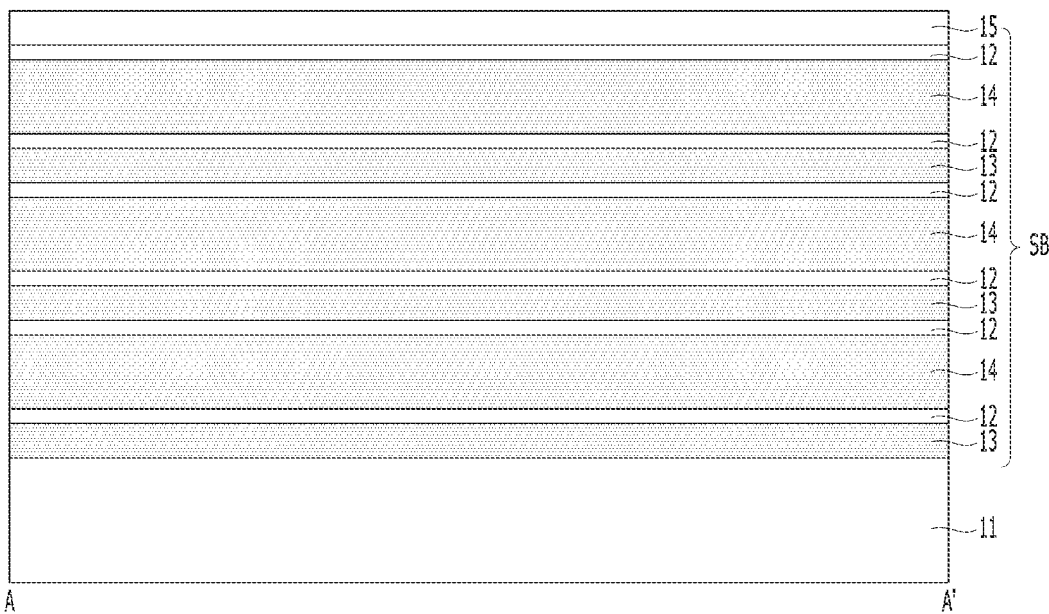
FIGS. 9 to 25 are diagrams illustrating a method of fabricating a semiconductor device according to embodiments of the present invention.

As shown in FIG. 9, a stack body SB including a plurality of sacrificial layers 12 and a plurality of semiconductor layers 13 and 14 may be formed on the lower structure 11. In the stack body SB, the plurality of sacrificial layers 12 and the plurality of semiconductor layers 13 and 14 may have a structure in which they are alternately stacked. The lower structure 11 may include a semiconductor substrate (such as SUB shown in FIG. 1). The lower structure 11 may include a peripheral circuit part. The lower structure 11 may include a semiconductor substrate, a peripheral circuit part on the semiconductor substrate, and low-level interconnections on the peripheral circuit part.

The plurality of semiconductor layers 13 and 14 may include first semiconductor layers 13 and second semiconductor layers 14. The first semiconductor layers 13 may be thinner than the second semiconductor layers 14. The second semiconductor layers 14 may be about 1.5 to 2 times thicker than the first semiconductor layers 13. For example, the first semiconductor layers 13 may have a thickness of about 20 nm, and the second semiconductor layers 14 may have a thickness of about 40 nm.

The plurality of sacrificial layers 12 may have the same thickness. The sacrificial layers 12 may be thinner than the first and second semiconductor layers 13 and 14. The sacrificial layers 12 may be thinner than the first semiconductor layers 13. For example, the sacrificial layers 12 may be about 10 nm thick.

The plurality of semiconductor layers 13 and 14 and the plurality of sacrificial layers 12 may be respectively formed by an epitaxial growth process. For example, the plurality of semiconductor layers 13 and 14 and the plurality of sacrificial layers 12 may be formed of a crystalline semiconductor or a crystalline semiconductor compound. In exemplary embodiments, the plurality of semiconductor layers 13 and 14 may include a first semiconductor material selected from monocrystalline silicon and monocrystalline silicon germanium, and the plurality of sacrificial layers 12 may include a second semiconductor material different from the first semiconductor material. For example, the plurality of semiconductor layers 13 and 14 may each be a monocrystalline silicon layer, and the plurality of sacrificial layers 12 may be a monocrystalline silicon germanium layer. In other embodiments, the plurality of sacrificial layers 12 may include a dielectric material.

In the stack body SB, sub-stacks stacked in the order of the sacrificial layer 12, the first semiconductor layer 13, the sacrificial layer 12, and the second semiconductor layer 14 may be repeatedly stacked several times. For example, the stack body SB may include sub-stacks of a SiGe/Si/SiGe/Si structure in the first semiconductor layers 13 and/or in the second semiconductor layers 14.

The stack body SB may further include an uppermost insulating layer 15. The insulating layer 15 may include silicon oxide. The insulating layer 15 is a hard mask and may be omitted.

Figure 10:

As shown in FIG. 10, at least one large slit 16 may be formed in the stack body SB. To form the large slit 16, a portion of the stack body SB may be etched to form a slit trench, and the large slit 16 may be subsequently filled. The large slit 16 when filed may include silicon oxide, silicon nitride, or a combination thereof. The large slit 16 may include an etch stopper S1, a liner S2, and a gap-fill material S3, and the gap-fill material S3 may include an embedded air gap S4. The etch stopper S1 may include SiCO, and the gap-fill material S3 may include silicon oxide. The liner S2 may include silicon nitride. The large slit 16 may correspond to the large slits LSL1 and LSL2 of FIG. 5. For a plan view of the large slit 16, reference will be made to the large slits LSL1 and LSL2 of FIG. 5.

For convenience of explanation in the drawings to be described later, illustration of the etch stopper S1, the liner S2, the gap-fill material S3, and the embedded air gap S4 is omitted, and only the large slit 16 is shown. That is, in the drawings to be described later, the large slit 16 has a structure including the etch stopper S1, the liner S2, the gap-fill material S3 and the embedded air gap S4 of FIG. 10.

Figure 11:
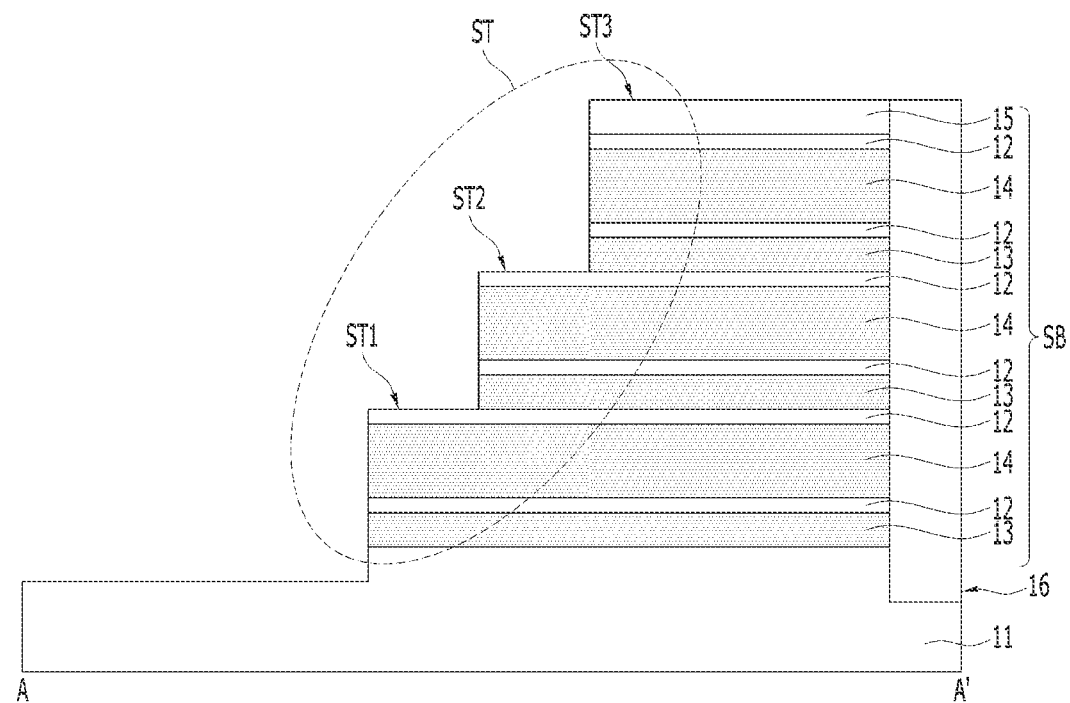

As illustrated in FIG. 11, a step-shaped structure ST may be formed on the stack body SB. For example, the step-shaped structure ST may be formed by etching the stack body SB. The step-shaped structure ST may be formed by repeatedly performing an etching process using a mask and a slimming etching process of the mask. The step-shaped structure ST may include a plurality of steps ST1 to ST3. The ends of the individual steps ST1 to ST3 may include a vertical flat surface. In the etching process of the stack body SB for forming the plurality of steps ST1 to ST3, the etching may be stopped on the surfaces of the sacrificial layers 12. The stepped structure ST may be referred to as a stepped contact part.

Figure 12:
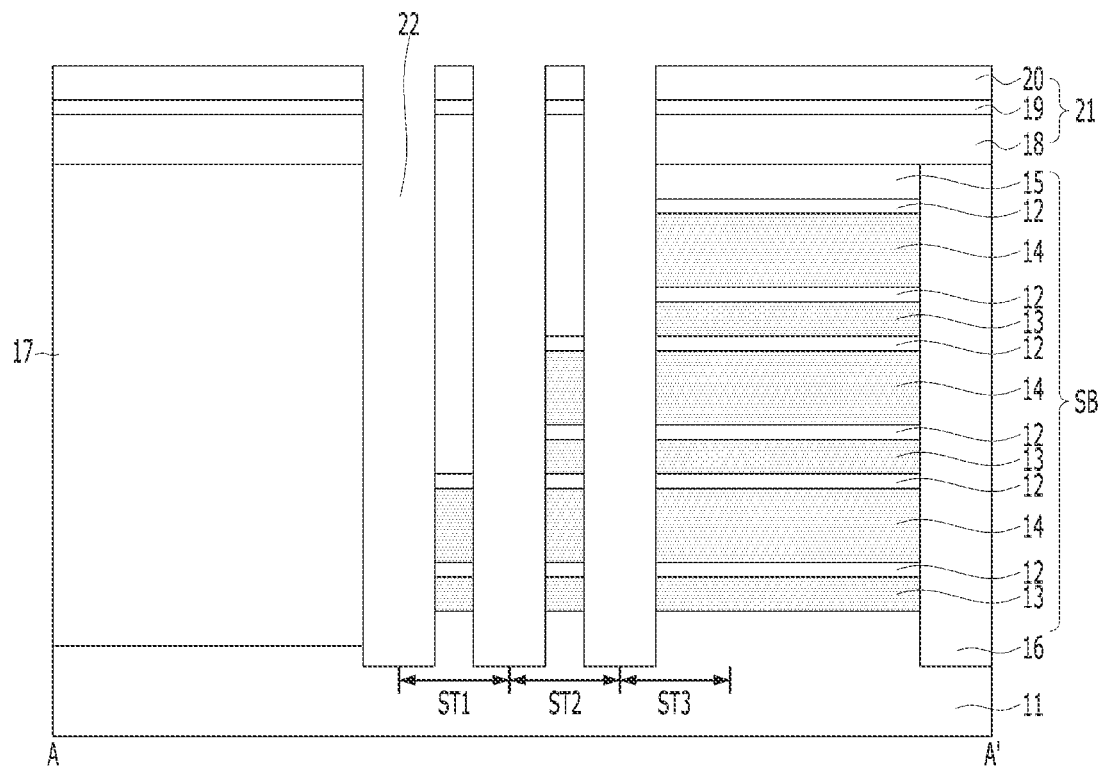

As illustrated in FIG. 12, an interlayer insulating layer 17 may be formed on the step-shaped structure ST. Subsequently, the interlayer insulating layer 17 may be planarized by using chemical mechanical polishing (CMP) to expose the insulating layer 15. The interlayer insulating layer 17 may include silicon oxide, silicon nitride, or a combination thereof.

Next, hole-shaped openings 22 penetrating the step-shaped structure ST and the interlayer insulating layer 17 may be formed.

To form the hole-shaped openings 22, a mask layer 21 may be formed on the insulating layer 15, and the step-shaped structure ST and the interlayer insulating layer 17 may be etched by using the mask layer 21. The mask layer 21 may be a material having an etch selectivity with respect to the insulating layer 15 and the stack body SB. The mask layer 21 may include photoresist, silicon nitride, silicon oxynitride, amorphous silicon, amorphous carbon, an anti-reflective coating (ARC) material, or a combination thereof.

For example, the mask layer 21 may include a stack of an amorphous carbon layer 18, a silicon oxynitride 19, and a photoresist 20.

The hole-shaped openings 22 may extend vertically through the stack body SB. The hole-shaped openings 22 may expose the surface of the lower structure 11. The hole-shaped openings 22 may pass through a boundary portion between the steps ST1, ST2, and ST3.

Figure 13:
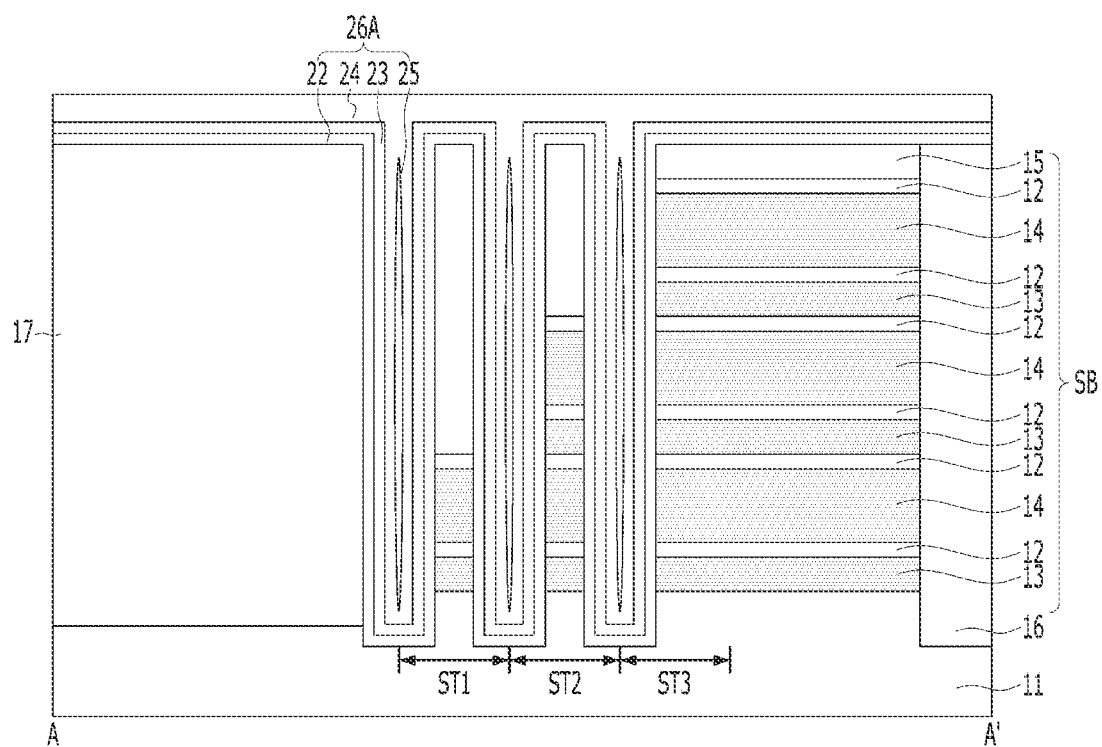

As illustrated in FIG. 13, a dielectric material 26A may be formed in the hole-shaped openings 22. The dielectric material 26A may sequentially form the etch stopper 22, the liner 23, and the gap-fill material 24. The gap-fill material 24 may include an embedded air gap 25. The etch stopper 22 may include SiCO, and the gap-fill material 24 may include silicon oxide. The liner 23 may include silicon nitride. The liner 23 may serve to prevent the etch stopper 22 from being oxidized during deposition of the gap-fill materials 24.

Figure 14:
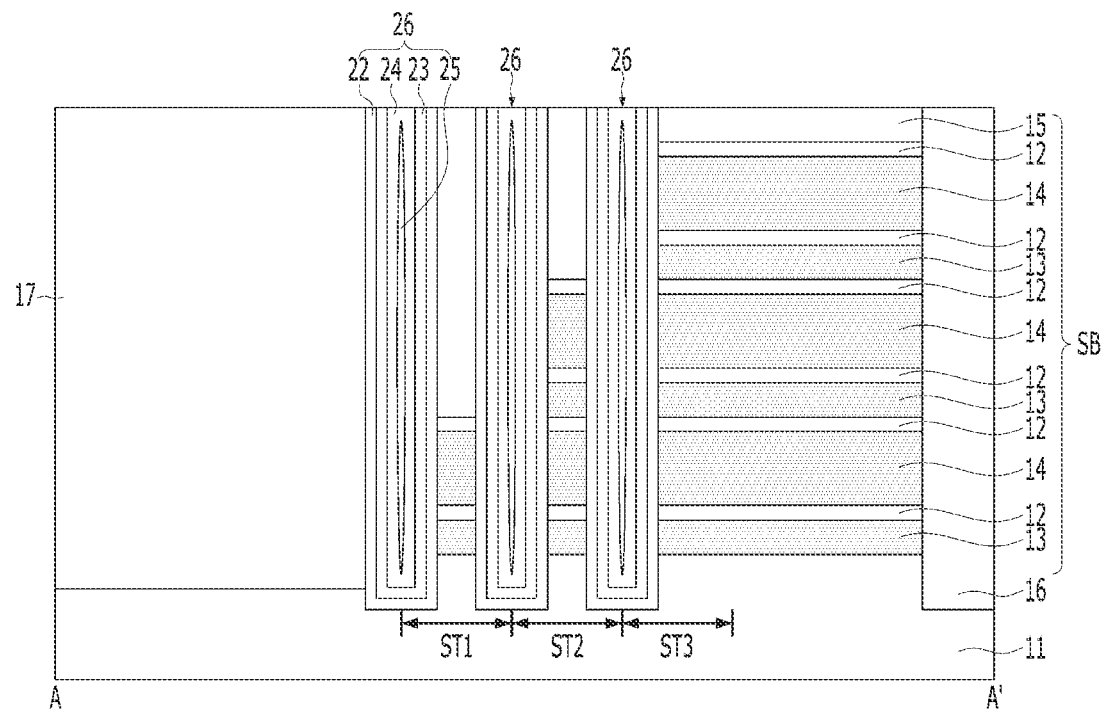

As illustrated in FIG. 14, the dielectric material 26A may be planarized to form the small slits 26. The small slits 26 may each fill the hole-shaped openings 22. The small slits 26 may penetrate the step-shaped structure. The small slits 26 may pass through a boundary portion between the steps ST1 to ST3. For example, the ends of the steps ST1 to ST3 may be penetrated. The small slits 26 may correspond to the small slits SSL1 and SSL2 of FIG. 5. A plan view of the small slit 26 will refer to the small slits SSL1 and SSL2 of FIG. 5.

Figure 15:
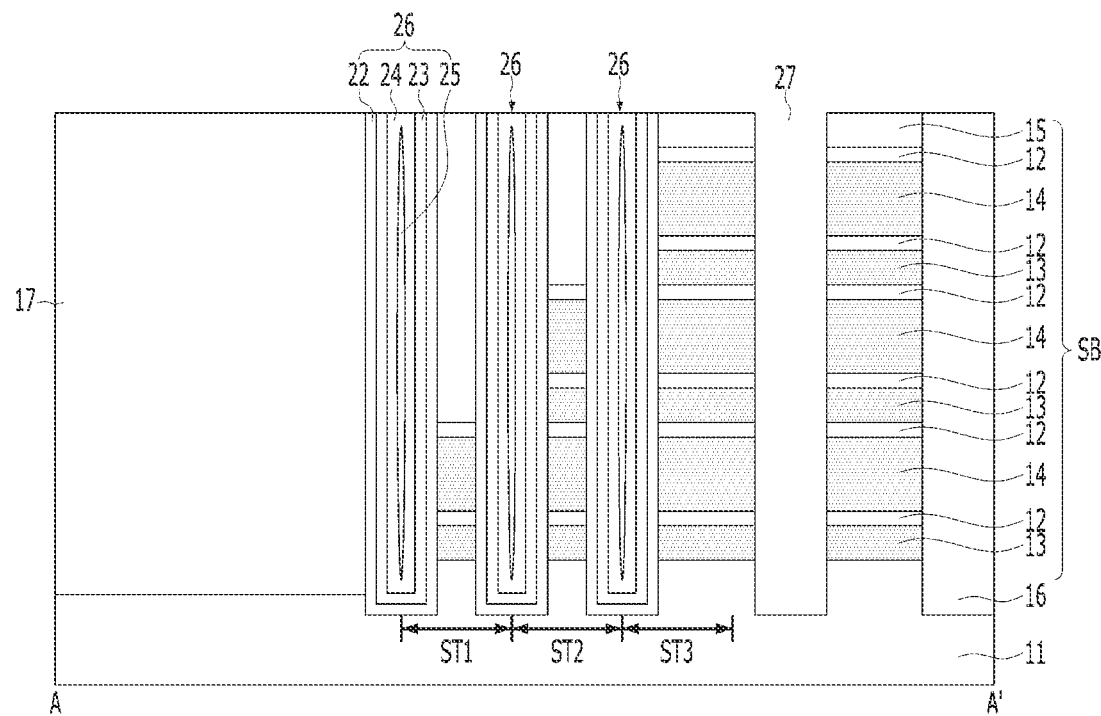

As shown in FIG. 15, another portion of the stack body SB may be etched to form a line-shaped opening 27. The line-shaped opening 27 may extend vertically to expose the surface of the lower structure 11. The line-shaped opening 27 may adjoin the small slits 26.

Figure 16:
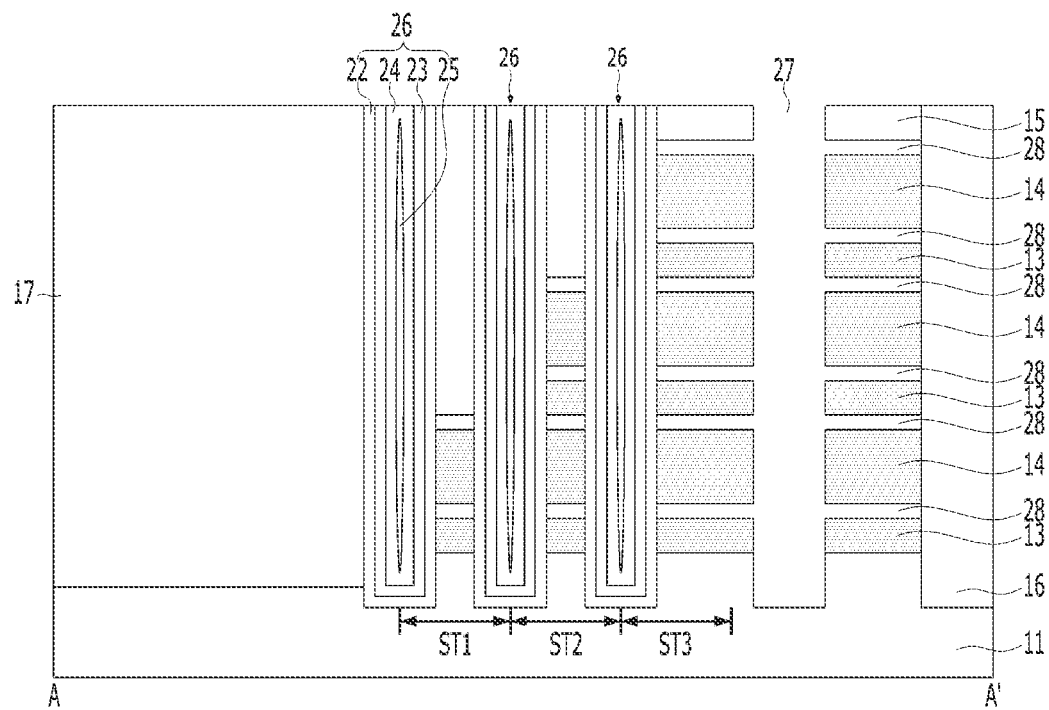

As illustrated in FIG. 16, the sacrificial layers 12 may be removed through the line-shaped opening 27. Accordingly, first recesses 28 may be formed between the first and second semiconductor layers 13 and 14. A lowermost first recess 28 may be formed between the lowermost first semiconductor layer 12 and the lower structure 11. An uppermost first recess 28 may be formed between the insulating layer 15 and the uppermost second semiconductor layer 14.

Figure 17:
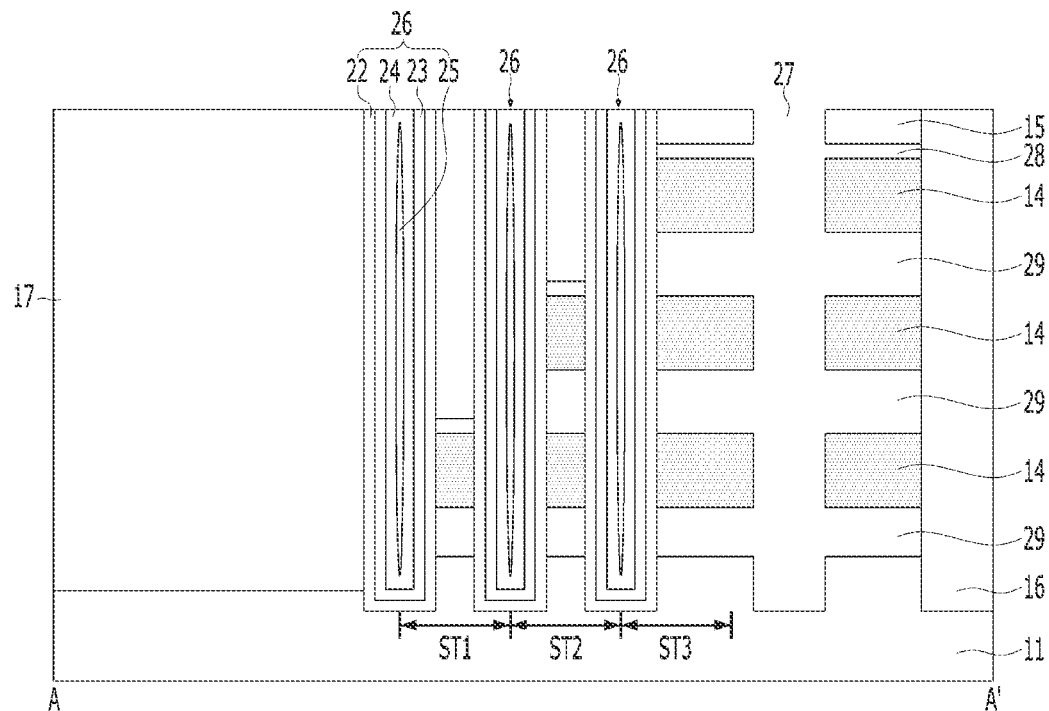

As illustrated in FIG. 17, the first semiconductor layers 13 may be removed through the line-shaped opening 27. Accordingly, second recesses 29 may be formed between the second semiconductor layers 14. A lowermost first recess 28 may be formed between the lowermost second semiconductor layer 14 and the lower structure 11. An uppermost first recess 28 may be maintained between the insulating layer 15 and the uppermost second semiconductor layer 14.

Figure 18:
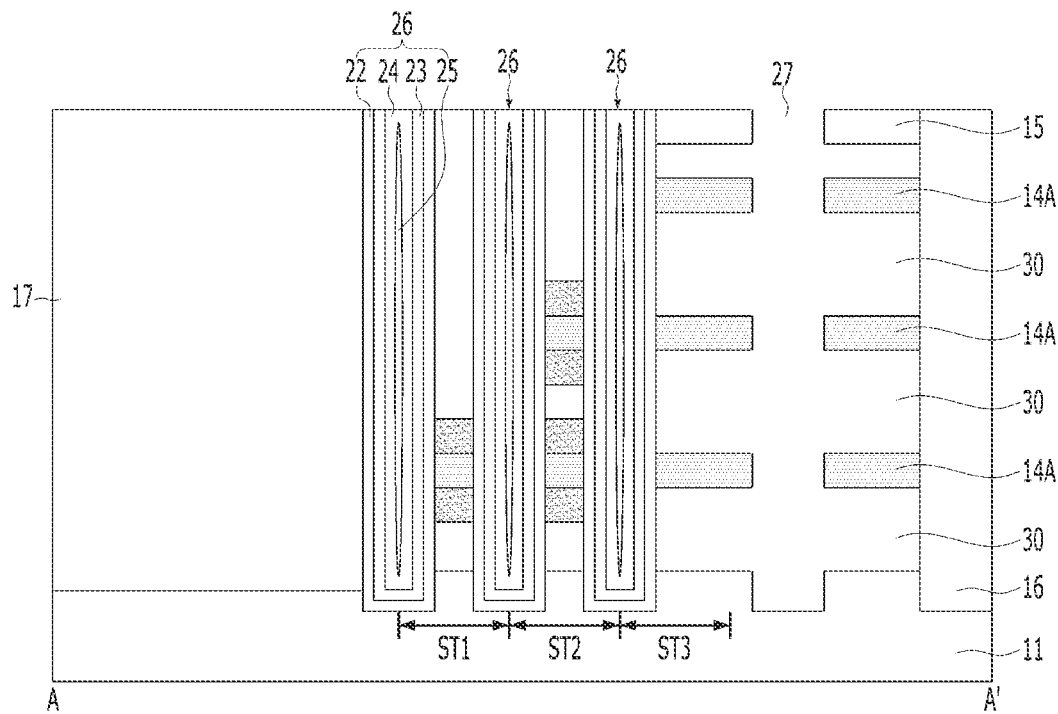

As illustrated in FIG. 18, active layers 14A may be formed by thinning the second semiconductor layers 14. Third recesses 30 may be formed between the active layers 14A. The third recesses 30 may be formed by extending the first recess 28 and the second recesses 29. A lowermost third recess 30 may be formed between the lowermost active layer 14A and the lower structure 11. An uppermost third recess 30 may be maintained between the insulating layer 15 and the uppermost active layer 14A. The uppermost third recess 30 may have a smaller height than other third recesses 30.

Figure 19:
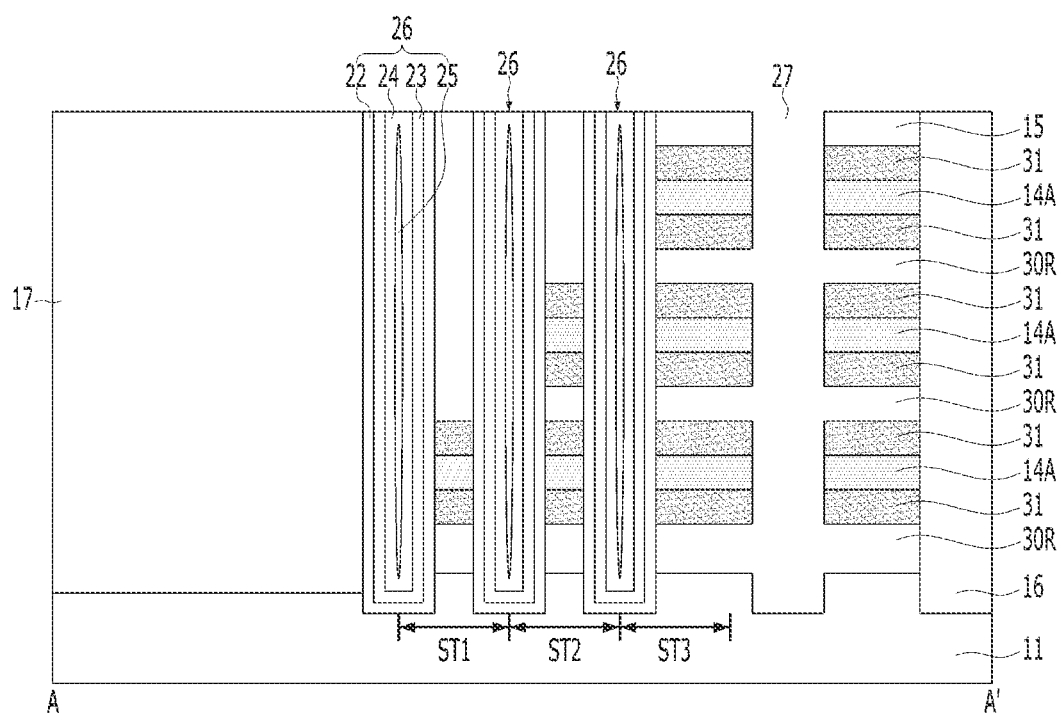

As illustrated in FIG. 19, an insulating sacrificial layer 31 may be formed on the active layers 14A. The insulating sacrificial layers 31 may include silicon nitride. After the insulating sacrificial layers 31 are formed, third recesses 30R having a smaller height may be formed between the insulating sacrificial layers 31.

Figure 20:
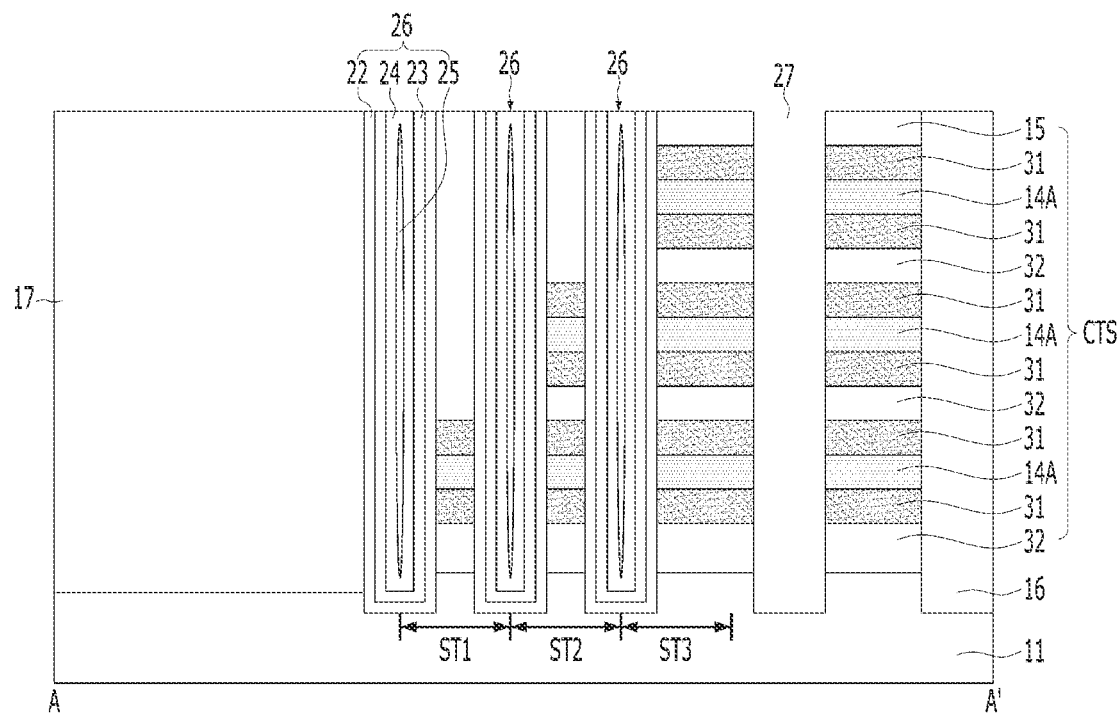

As shown in FIG. 20, horizontal level insulating layers 32 may be formed in the third recesses 30R. The horizontal level insulating layers 32 may include silicon oxide.

Referring to FIGS. 16 to 20, a stack of the sacrificial layers 12, the first semiconductor layer 13, and the second semiconductor layers 14 may be replaced with a stack of the active layers 14A, the insulating sacrificial layer 31, and the horizontal level insulating layers 32 by a series of processes. The horizontal level insulating layers 32 may be referred to as cell isolation layers. The stacks of the active layers 14A, the insulating sacrificial layers 31, and the horizontal level insulating layers 32 may be referred to as a contact stack CTS.

In the contact stack CTS, a plurality of sub-stacks stacked in the order of the horizontal level insulating layer 32, the insulating sacrificial layer 31, the active layer 14A and the insulating sacrificial layer 31 may be repeatedly stacked several times. An end of the contact stack CTS may have a step shape. The contact stack CTS may be referred to as a stepped contact stack.

Figure 21:
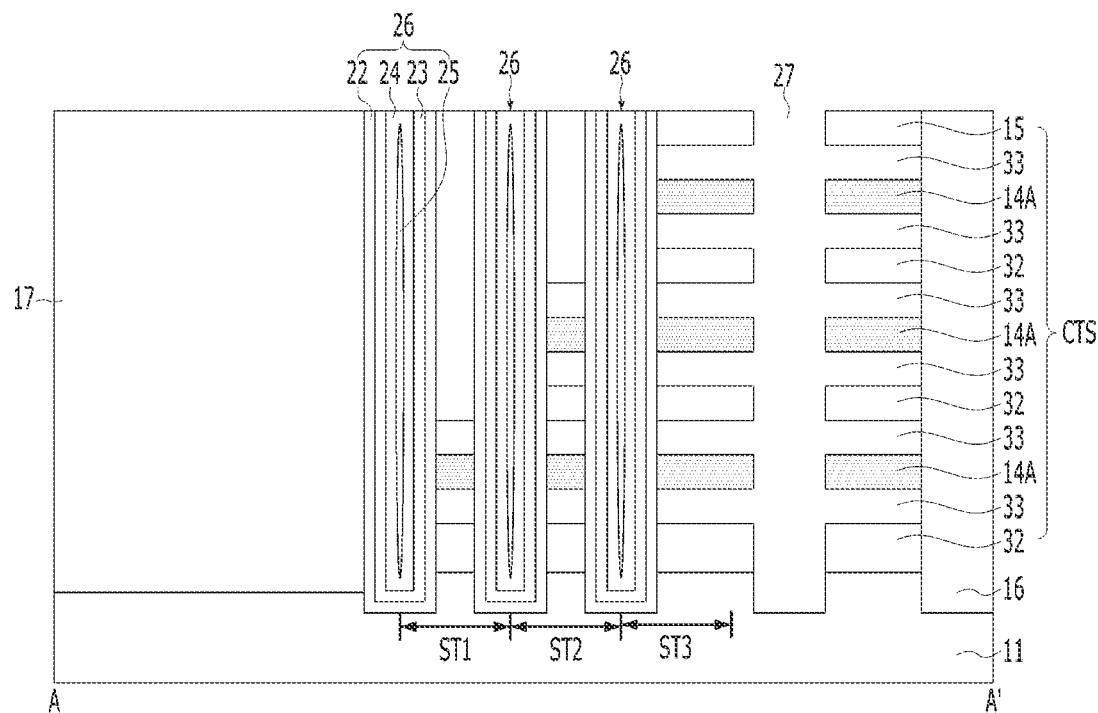

As shown in FIG. 21, the insulating sacrificial layers 31 of the contact stack CTS may be selectively removed through the line-shaped opening 27. Accordingly, word line level recesses 33 may be formed between the active layers 14A and the horizontal level insulating layers 31. The insulating sacrificial layers 31 may be removed by using wet etching. Loss of the small slits 26 and the large slits 16 may be prevented by the etch stoppers 22 during wet etching of the insulating sacrificial layers 31.

Figure 22:
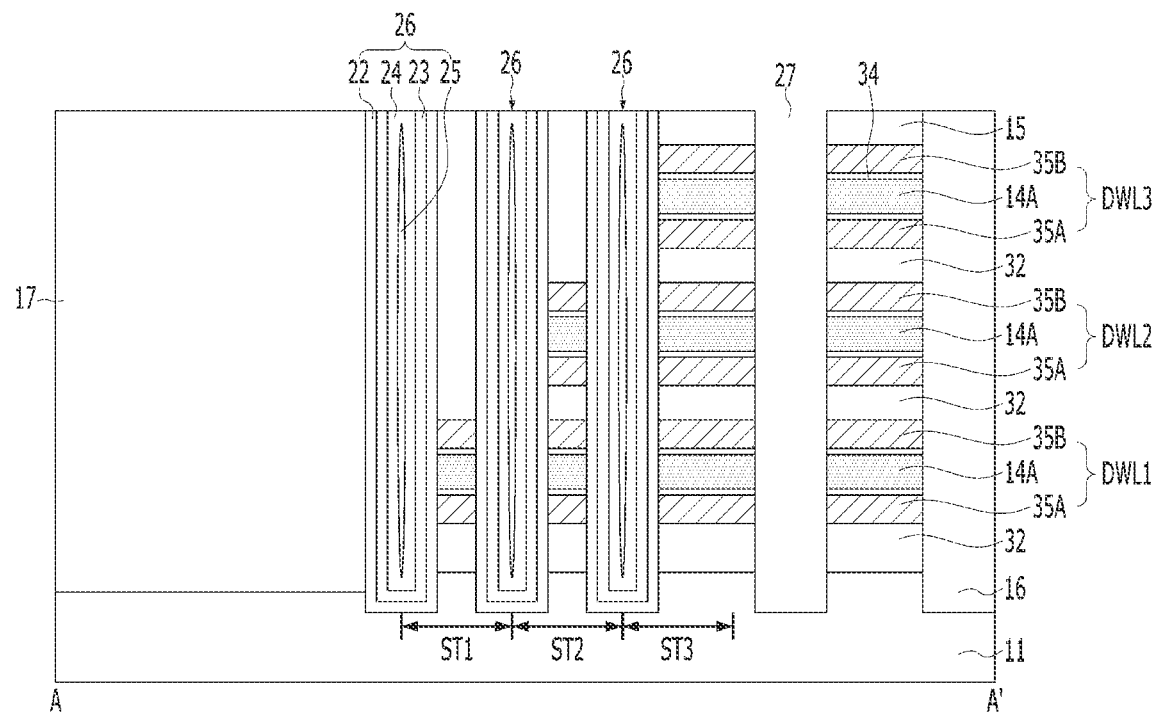

As shown in FIG. 22, first and second word lines 35A and 35B filling the word line level recesses 33 may be formed. Before forming the first and second word lines 35A and 35B, gate insulating layers 34 may be formed on the surfaces of the active layers 14A. Although not shown, first and second word lines 35A and 35B and gate insulating layers 34 may be formed in the cell array unit CAR as shown in FIGS. 5 to 7. The first and second word lines 35A and 35B of FIG. 22 may correspond to edge portions of the first and second word lines extending from the first and second word lines of the cell array unit.

The first word lines 35A and the second word lines 35B may constitute the word lines DWL1 to DWL3. Each of the word lines DWL1 to DWL3 may have a double word line structure of the first word line 35A and the second word line 35B.

Referring to FIGS. 21 and 22, the insulating sacrificial layers 31 of the contact stack CTS may be replaced with first word lines 35A and second word lines 35B.

Figure 23:
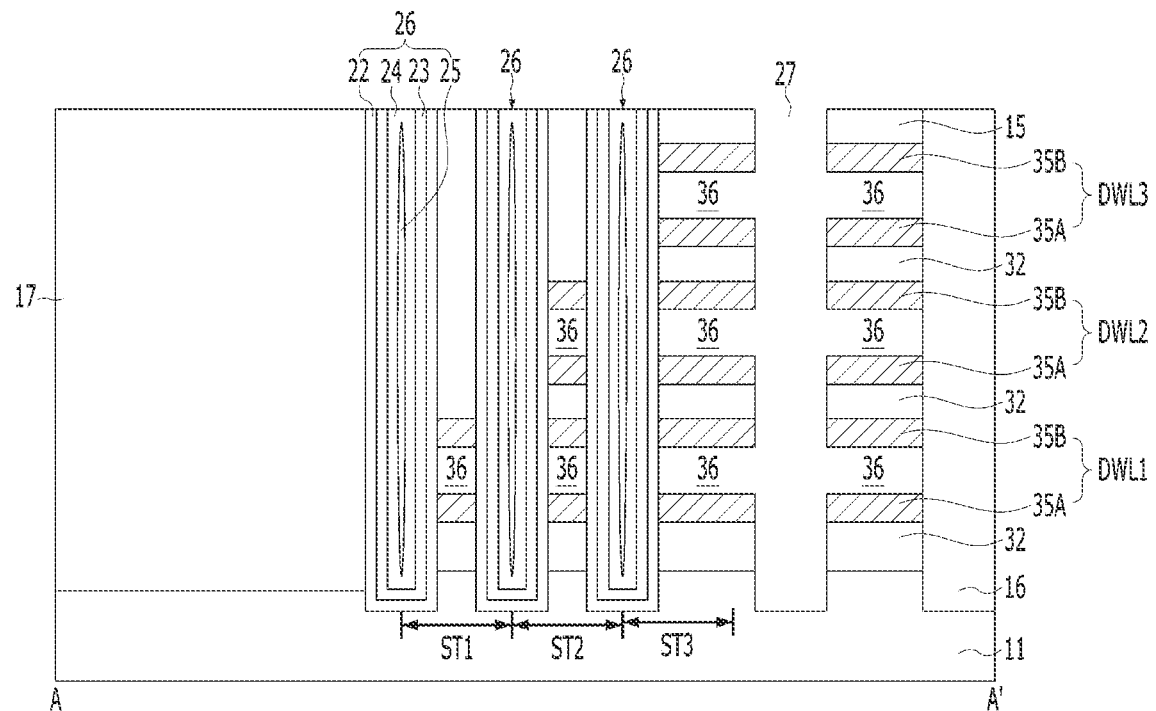

As shown in FIG. 23, the active layers 14A and the gate insulating layers 34 of the contact stack CTS may be selectively removed through the line-shaped opening 27. Accordingly, pad level recesses 36 may be formed between the first word lines 35A and the second word lines 35B. The active layers 14A and the gate insulating layers 34 may be removed by using wet etching. Loss of the small slits 26 and the large slits 16 may be prevented by the etch stoppers 22 during the wet etching of the active layers 14A and the gate insulating layers 34. In particular, although the gate insulating layers 34 include oxide, since the etch stopper 22 includes SiCO, the etch stopper 22 may serve as an etch stop layer while the gate insulating layers 34 are wet-etched.

Figure 24:
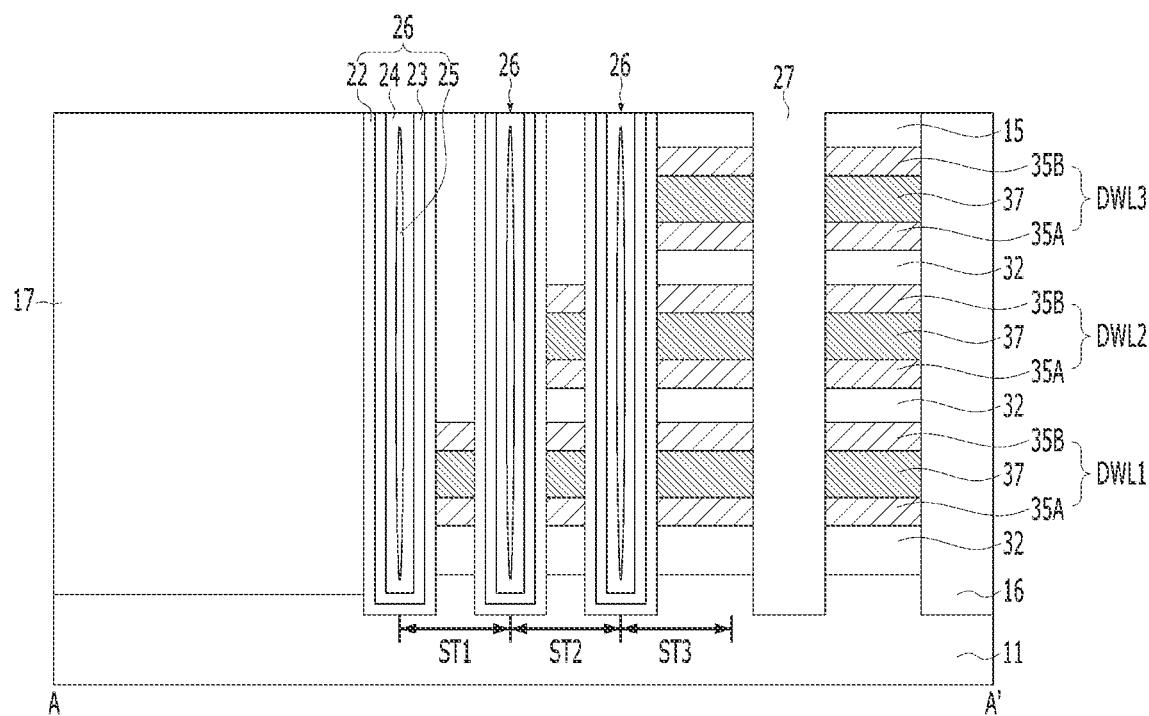

As shown in FIG. 24, word line pad parts 37 filling the pad level recesses 36 may be formed. The word line pad parts 37 may directly contact the first and second word lines 35A and 35B.

Figure 25:
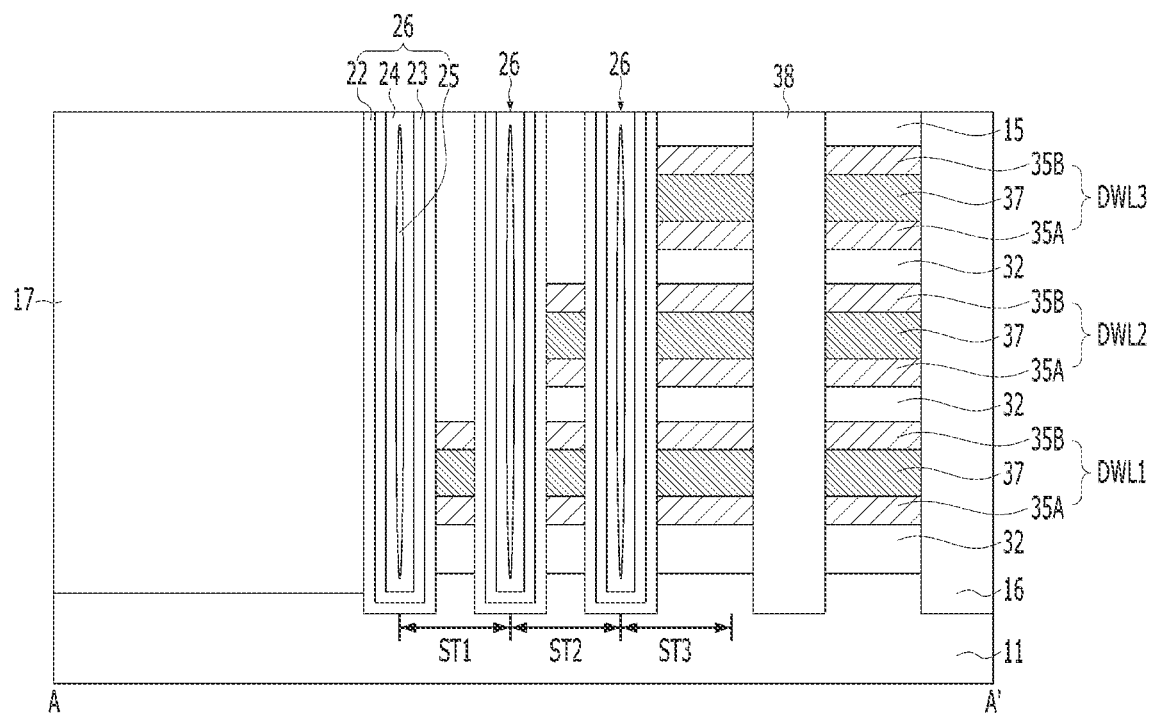

As shown in FIG. 25, a word line isolation slit 38 may be formed to fill the line-shaped opening 27. The word line isolation slit 38 may include silicon oxide, SiCO, silicon nitride, or a combination thereof.

According to the above-described embodiments, since the active layers 14A between the first and second word lines 35A and 35B are replaced with the word line pad parts 37 to form the thick word line pad parts 37, the resistance of word the word lines DWL1 to DWL3 may be improved.

Figure 26A:
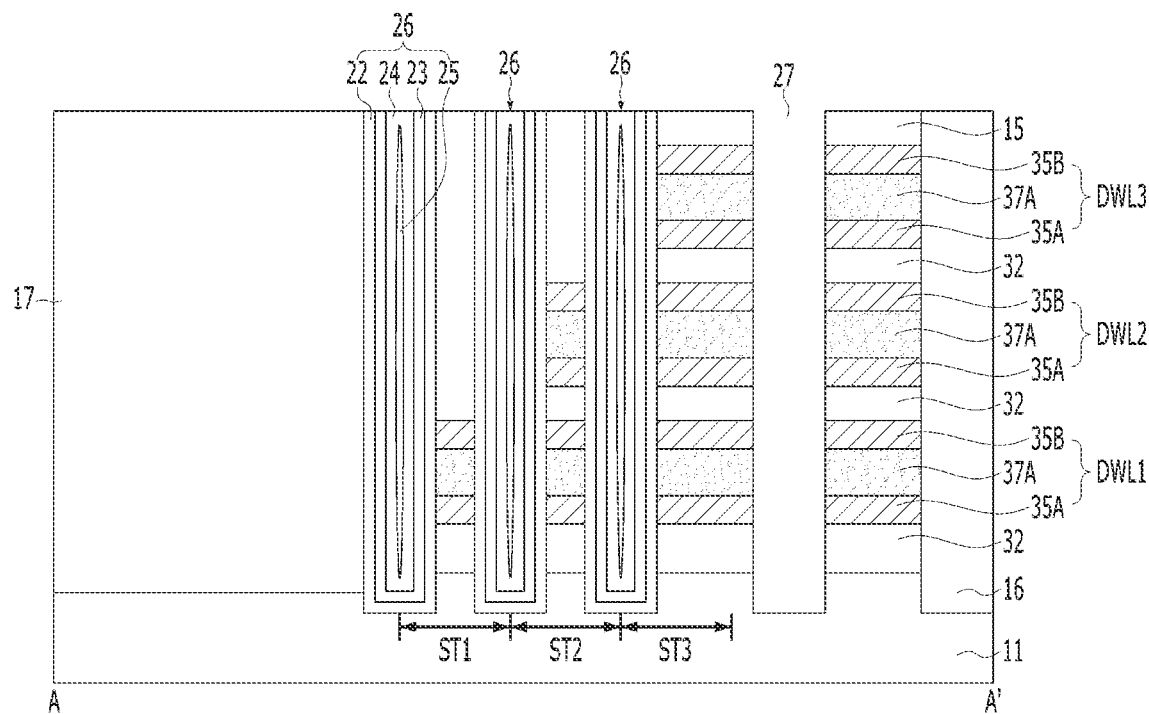
FIGS. 26A and 26B are diagrams illustrating a method of fabricating a semiconductor device according to another embodiment of the present invention.
Figure 26B:
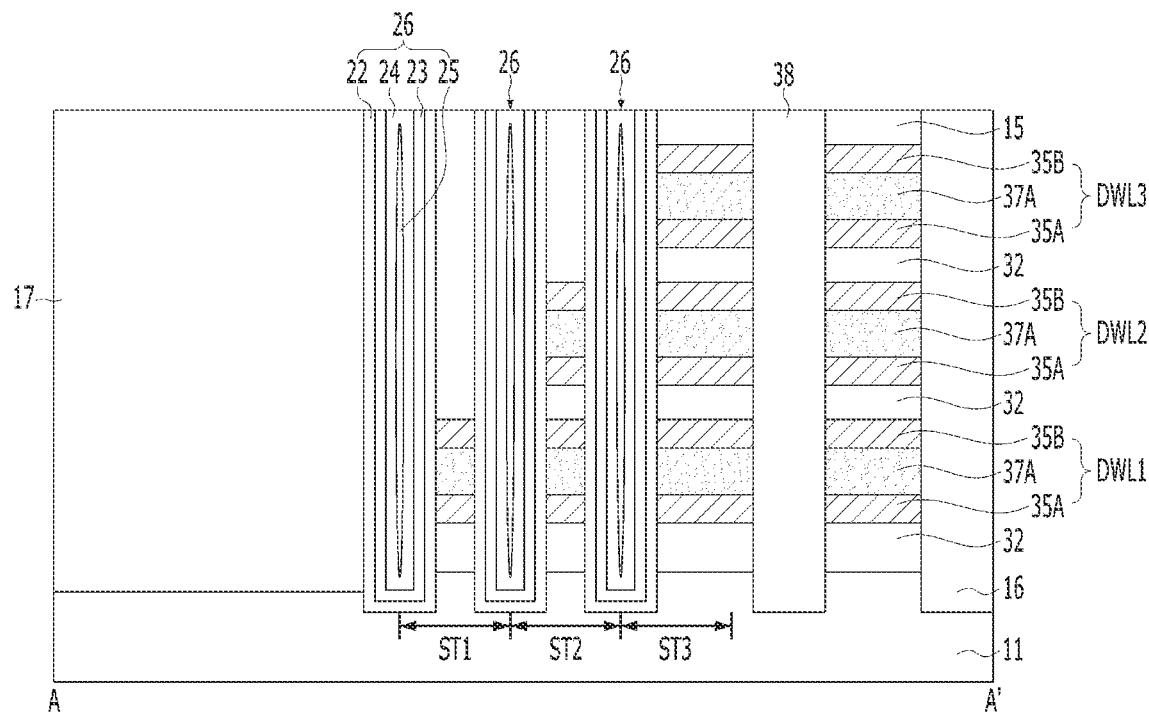

FIGS. 26A and 26B are diagrams illustrating a method of fabricating a semiconductor device according to another embodiment of the present invention.

By a series of methods shown in FIGS. 9 to 23, pad level recesses 36 may be formed, as shown in FIG. 23.

Next, as shown in FIG. 26A, insulating pad parts 37A filling the pad level recesses 36 may be formed. The insulating pad parts 37A may directly contact the first and second word lines 35A and 35B. The insulating pad parts 37A may include silicon oxide, silicon nitride, SiCO, or a combination thereof.

As shown in FIG. 26B, a word line isolation slit 38 may be formed to fill the line-shaped opening 27. The word line isolation slit 38 may include silicon oxide, SiCO, silicon nitride, or a combination thereof.

Figure 27:
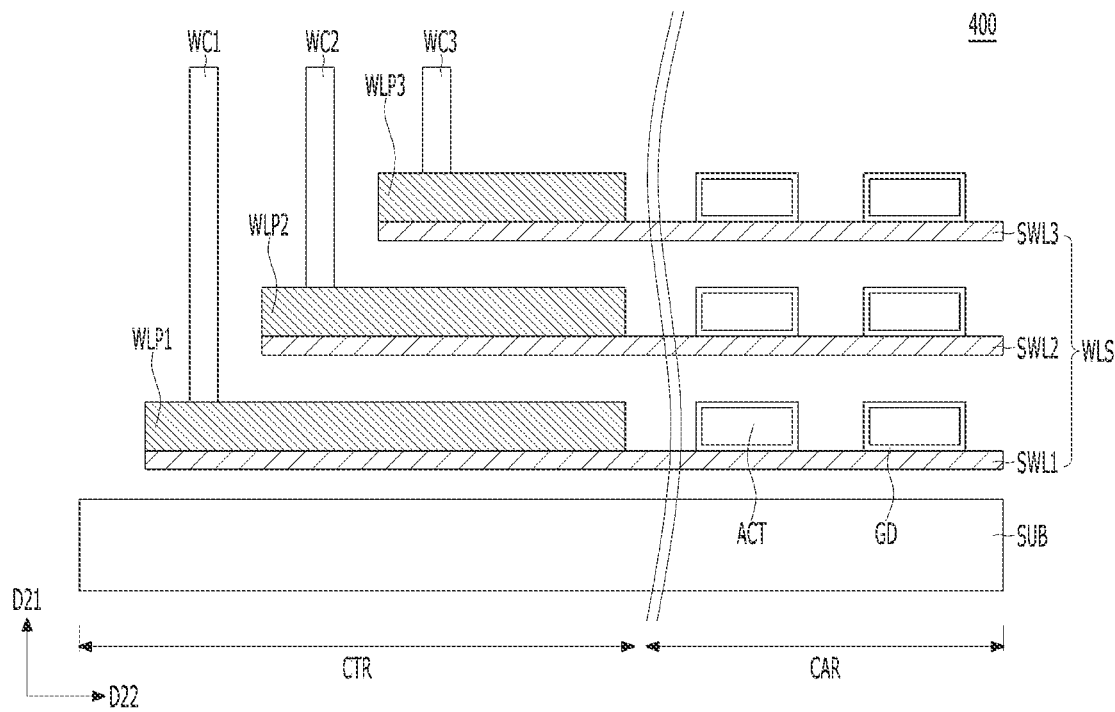
FIGS. 27 and 28 are schematic cross-sectional views of semiconductor devices according to other embodiments of the present invention.

FIG. 27 is a schematic cross-sectional view of a semiconductor device according to another embodiment. The semiconductor device 400 of FIG. 27 may be similar to the semiconductor device of FIGS. 1 to 26B. Hereinafter, for a detailed description of the duplicate components, reference will be made to FIGS. 1 to 26B and the accompanying description. In FIG. 27, the first direction D21 may correspond to the first direction D1 of FIG. 1, and the second direction D22 may correspond to the third direction D3 of FIG. 1 and the first direction D11 of FIG. 5.

Referring to FIG. 27, the semiconductor device 400 may include a word line stack WLS, and the word line stack WLS may include a plurality of single word lines SWL1 to SWL3. The single word lines SWL1 to SWL3 may be vertically stacked along the first direction D21. The single word lines SWL1 to SWL3 may horizontally extend along the second direction D22. A gate dielectric layer GD may be disposed between the single word lines SWL1 to SWL4 and the active layers ACT.

The semiconductor device 400 may include a memory cell array CAR and a contact portion CTR. The word line stack WLS may be located in the cell array unit CAR, and the word line pads WLP1, WLP2, and WLP3 may be located in the contact portion CTR.

A plurality of word line pads WLP1 to WLP3 may be disposed in the contact portion CTR. The word line pads WLP1 to WLP3 may provide a step shape. The word line pads WLP1 to WLP3 may horizontally extend along the second direction D22. A horizontal length may gradually increase from the lowest word line pad WLP1 to the highest word line pad WLP3. Contact plugs WC1, WC2, and WC3 may be respectively connected to the word line pads WLP1 to WLP3. The word line pads WLP1 to WLP3 may have different horizontal lengths along the second direction D22. Each of the single word lines SWL1 to SWL3 may be thinner than the word line pads WLP1 to WLP3. For example, as seen in FIG. 27, when comparing vertical heights in the first direction D21, the single word lines SWL1 to SWL3 may have a thickness smaller than that of the word line pads WLP1 to WLP3.

Figure 28:
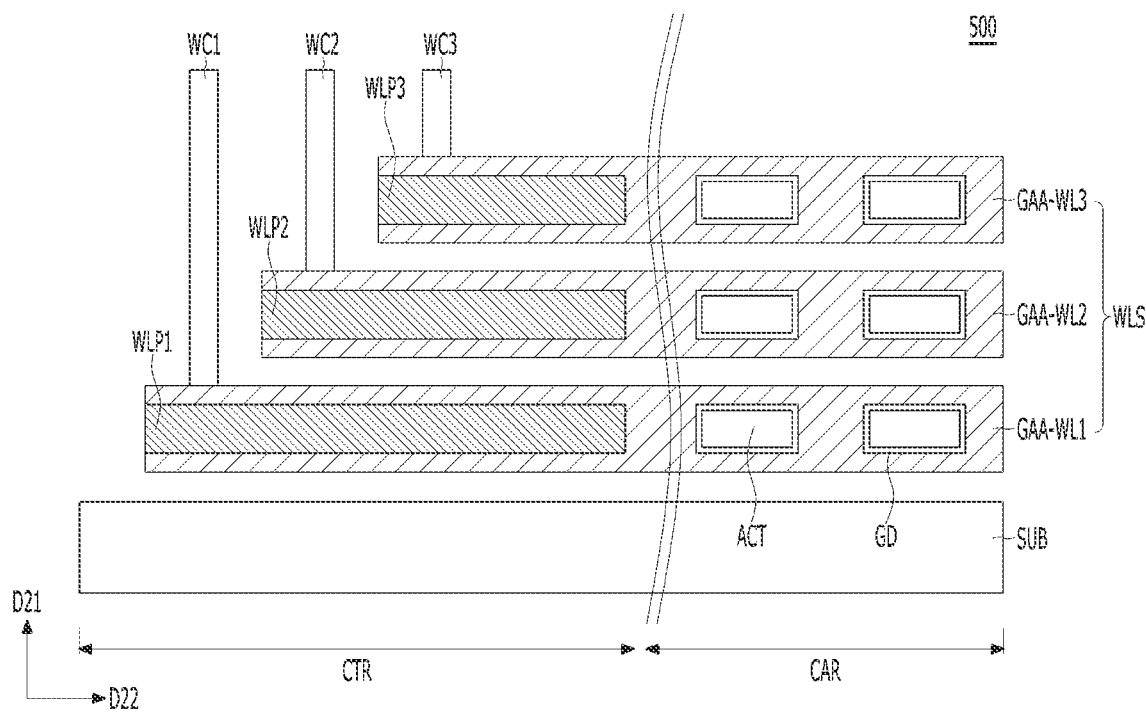

FIG. 28 is a schematic cross-sectional view of a semiconductor device according to another embodiment. The semiconductor device 500 of FIG. 28 may be similar to the semiconductor device of FIGS. 1 to 26B. Hereinafter, for a detailed description of the duplicate components, reference will be made to FIGS. 1 to 26B and the accompanying description. In FIG. 28, the first direction D21 may correspond to the first direction D1 of FIG. 1, and the second direction D22 may correspond to the third D3 of FIG. 1 and the first direction D11 of FIG. 5.

Referring to FIGS. 1, 2, 3, and 28, the semiconductor device 500 may include a word line stack WLS, and the word line stack WLS may include a plurality of gate all-around word lines GAA-SL1 to GAA-WL3. The gate all-around word lines GAA-WL1 to GAA-WL3 may be vertically stacked in the first direction D21. The gate all-around word lines GAA-WL1 to GAA-WL3 may horizontally extend along the second direction D22. The gate all-around word lines GAA-WL1 to GAA-WL3 may surround the active layers ACT adjacent in the third direction D22, and the gate insulating layers GD may surround the active layers ACT.

The semiconductor device 500 may include a cell array unit CAR and a contact portion CTR. The word line stack WLS may be located in the cell array unit CAR, and the word line pads WLP1, WLP2, and WLP3 may be located in the contact portion CTR.

A plurality of word line pads WLP1 to WLP3 may be disposed in the contact portion CTR. The word line pads WLP1 to WLP3 may provide a step shape. The word line pads WLP1 to WLP3 may horizontally extend along the second direction D22. A horizontal length may gradually increase from the lowest word line pad WLP1 to the highest word line pad WLP3. Contact plugs WC1, WC2, and WC3 may be respectively connected to the word line pads WLP1 to WLP3. The word line pads WLP1 to WLP3 may have different horizontal lengths along the second direction D22. Each of the gate all-around word lines GAA-WL1 to GAA-WL3 may have the same vertical height as the word line pads WLP1 to WLP3.

The present invention described above is not limited to the above-described embodiments and the accompanying drawings, but it will be apparent to those skilled in the art that various changes and modifications can be made within the scope of the technical spirit of the present invention.

What is claimed is:

1. A semiconductor device comprising:
   a word line stack disposed over a lower structure and including a plurality of word lines stacked in a direction vertical to a surface of the lower structure; and
   pillar-shaped slits penetrating edge parts of the word lines and including an etch stopper,
   wherein the etch stopper includes a carbon-based material.

2. The semiconductor device of claim 1, wherein each of the word lines include a double word line including a first word line and a second word line.

3. The semiconductor device of claim 1,
   wherein the etch stopper of the pillar-shaped slits directly contacts the word lines.

4. The semiconductor device of claim 1, wherein the etch stopper of the pillar-shaped slits includes a carbon-containing silicon oxide.

5. The semiconductor device of claim 1, wherein the pillar-shaped slits further include a liner over the etch stopper and a gap-fill material over the liner.

6. The semiconductor device of claim 5, wherein the gap-fill material includes an embedded air gap.

7. The semiconductor device of claim 5, wherein the liner includes silicon nitride, and the gap-fill material includes silicon oxide.

8. The semiconductor device of claim 1, wherein the edge parts of the word lines have a step shape.

9. The semiconductor device of claim 1, further including a linear slit supporting the word line stack.

10. The semiconductor device of claim 9, wherein the linear slit includes a linear etch stopper, the linear edge stopper directly contacting the word line stack.

11. The semiconductor device of claim 10, wherein the linear etch stopper includes a carbon-containing silicon oxide.

12. The semiconductor device of claim 1, wherein each of the word lines includes a single word line or a gate all-around word line.

13. A semiconductor device comprising:
    a word line stack disposed over a lower structure and including a word line stack including a plurality of word lines stacked in a vertical direction to a surface of the lower structure;
    pillar-shaped slits supporting edge parts of each of the word lines and including a first etch stopper;
    a linear slit supporting the word line stack and including a second etch stopper;
    a plurality of active layers disposed between the word line and horizontally spaced apart from each other;
    a bit line commonly connected to first ends of the active layers and extending in a vertical direction to a surface of the lower structure; and
    capacitors respectively connected to second ends of the active layers and stacked in a vertical direction to a surface of the lower structure.

14. The semiconductor device of claim 13, wherein the first and second etch stoppers directly contact the edge parts of the word lines.

15. The semiconductor device of claim 13, wherein the first and second etch stoppers include a carbon-containing silicon oxide.

16. The semiconductor device of claim 13, wherein each of the pillar-shaped slits and the linear slits include a liner over the first and second etch stoppers and a gap-fill material including an embedded air gap over the liner.

17. The semiconductor device of claim 16, wherein the liner includes silicon nitride, and the gap-fill material includes silicon oxide.

* * * * *